United States Patent [19]

Yamada et al.

[11] Patent Number: 5,581,141

[45] Date of Patent: Dec. 3, 1996

[54] SURFACE ACOUSTIC WAVE FILTER

[75] Inventors: Toru Yamada, Katano; Toshio Ishizaki, Kobe; Kazunori Nishimura, Yawata; Kozo Murakami, Osaka, all of Japan

[73] Assignee: Matsushita Electric Industrial Co., Ltd., Osaka, Japan

[21] Appl. No.: 319,790

[22] Filed: Oct. 7, 1994

[30] Foreign Application Priority Data

Oct. 8, 1993 [JP] Japan ................................. 5-252682
Jun. 2, 1994 [JP] Japan ................................. 6-121078

[51] Int. Cl.⁶ ................................................. H01L 41/08
[52] U.S. Cl. ........................... 310/313 D; 310/313 B; 333/195
[58] Field of Search ......................... 310/313 B, 313 D, 310/313 R; 333/150–155, 193–196

[56] References Cited

U.S. PATENT DOCUMENTS

| | | | |
|---|---|---|---|
| 4,542,356 | 9/1985 | Nakazawa et al. | 310/313 D |
| 4,803,449 | 2/1989 | Hikita et al. | 333/193 |
| 5,059,848 | 10/1991 | Mariani | 310/313 R |
| 5,077,545 | 12/1991 | Gopani et al. | 333/195 |
| 5,202,652 | 4/1993 | Tabuchi et al. | 333/193 |
| 5,223,762 | 6/1993 | Masaie et al. | 310/313 D |
| 5,239,517 | 8/1993 | Mariani | 310/313 BX |
| 5,349,260 | 9/1994 | Anemogiannis et al. | 310/313 D |
| 5,365,138 | 11/1994 | Saw et al. | 310/313 D |
| 5,374,908 | 12/1994 | Wright | 333/195 |
| 5,426,339 | 6/1995 | Wright | 310/313 D |
| 5,438,305 | 8/1995 | Hikita et al. | 310/313 RX |

FOREIGN PATENT DOCUMENTS

| | | |
|---|---|---|
| 0269064 | 6/1988 | European Pat. Off. . |
| 60-87513 | 9/1985 | Japan . |
| 63-285018 | 11/1988 | Japan . |
| 4-124907 | 4/1992 | Japan . |
| 4-373304 | 12/1992 | Japan . |
| 6-177703 | 6/1994 | Japan . |
| 6-276046 | 9/1994 | Japan . |

Primary Examiner—Mark O. Budd
Attorney, Agent, or Firm—Fish & Richardson P.C.

[57] ABSTRACT

A SAW resonator disposed with an IDT electrode and reflector electrodes is formed on the surface of a piezoelectric substrate. Three pieces of the SAW resonator form an acoustic coupling by being disposed close to each other, electrode fingers comprising the IDT electrode in the center are all grounded, and IDT electrode fingers are electrically independent on the side to be connected to input-output terminals of the IDT electrodes disposed outside. As a result, three excitation modes having different propagation frequencies are generated which are used to attain a broad band SAW resonator filter. When these three pairs of the IDT electrode are electrically independent, a balanced input-output can be achieved, and excellent out-of-band rejection characteristics can be obtained.

10 Claims, 24 Drawing Sheets

SURFACE ACOUSTIC WAVE FILTER

FIELD OF THE INVENTION

This invention relates to a surface acoustic wave filter used for a high frequency circuit of a radio.

BACKGROUND OF THE INVENTION

A conventional surface acoustic wave (SAW) filter has been used extensively for communication equipment as a RF- and IF-stage filter within the reception and transmission circuits. Along with the recent development of mobile communication towards becoming digitalized, a digital mobile telephone or a digital cordless telephone has been intensively developed. In the communication system of these devices, a phase as well as an amplitude convey information, so that it is essential for a filter used for an IF-stage that the filter not only has excellent amplitude characteristics but also is flat in group delay deviation characteristics. Furthermore, this filter is required to have excellent selectivity characteristics for distinguishing a signal of a neighboring channel from a desired signal, for which steep out-of-band rejection characteristics are needed. In addition, along with the recent miniaturization of a set to attain higher mounting density, coupling or interference between components caused by lack in grounding strength and in screening has become a problem. Therefore, a balanced type circuit for controlling these influences has been rapidly developed.

Well-known conventional SAW filters which can be used for the IF-stage are a transversal type SAW filter and two types of SAW resonator filters which are a longitudinally coupled resonator filter and a transversely coupled resonator filter. The transversal type SAW filter has excellent group delay deviation characteristics. However, the insertion loss and the size are big, and in addition, the out-of-band rejection is poor. On the other hand, the SAW resonator filters have excellent out-of-band rejection characteristics and are small in insertion loss and size, but the group delay deviation characteristics are inferior to that of the transversal type SAW filter. In addition, the longitudinally coupled resonator type is characterized by the large spurious present on the close and high side of a pass band, while the transversely coupled resonator type is characterized by having extremely narrow-band pass characteristics. As a conventional IF filter of mobile communication, the transversely coupled resonator type SAW filter was used commonly which had a compactsize and excellent out-of-band rejection characteristics.

A conventional transversely coupled resonator type SAW filter will be explained with reference to FIG. 24.

FIG. 24 shows an electrode pattern of a conventional transversely coupled resonator type SAW filter. Referring to FIG. 24, reference numeral 241 represents a monocrystal piezoelectric substrate on which an electrode pattern is formed to generate a surface acoustic wave. 242a is an inter-digital transducer (IDT) electrode which is disposed with reflectors 242b and 242c on both sides to form an energy trapping type SAW resonator. The same type of SAW resonator is formed by an IDT electrode 243a and reflectors 243b, 243c. When the above-mentioned two resonators are closely disposed to each other, an acoustic coupling occurs between the two resonators, thereby constructing a SAW resonator filter of the first stage. A SAW resonator filter of the second stage is constructed in the same manner as mentioned above by means of IDT electrodes 244a, 245a and reflectors 244b, 244c, 245b, and 245c. These two stages of SAW resonator filters are concatenately connected electrically through an electrode pattern 246 to comprise a multistage connected SAW filter.

In case of the SAW filter constructed above, the mode frequencies of the two different surface acoustic waves to be excited on the surface of the piezoelectric substrate are determined through an electrode overlap width of the IDT electrode and through a distance between the two closely disposed SAW resonators, thereby fixing the pass band width of the filter. However, this filter is characterized by its extremely narrow-band width to be achieved, so the above-noted structure of FIG. 24 can realize a fractional band width (band width standardized by the center frequency of a filter) of about 0.1% at the very most for the filter. In addition, since input-output impedance characteristics depend on the size of the above-noted IDT electrode finger overlap width, it is difficult to achieve optional impedance. Furthermore, the electrode structure of FIG. 24 can not achieve a balanced input-output due to the fact that the electrode fingers of IDT electrodes 242a, 245a are grounded on one side.

In order to keep step with the digitalization mentioned above, a flat band in group delay deviation characteristics is required to be broadened by broadening pass characteristics. Furthermore, a balanced input-output needs to be attained. In the conventional method, an elongation coil was inserted between stages of a filter and a ground when the band needed to be broadened. A connection with surrounding circuits was attained by adding matching circuits at input-output stages.

This conventional structure, however, had a defect in that the circuit itself was large due to an increased number of components, since elongation coils or matching circuit elements were connected as the external circuits. At the same time, both the differences in and coupling of these elements affected the filter characteristics negatively, and furthermore, the input-output was unbalanced.

SUMMARY OF THE INVENTION

An object of this invention is to solve the above-mentioned problems by providing a SAW filter which has a compactsize, has a broad band and stable characteristics, and is also capable of a balanced type input-output.

In order to accomplish these and other advantages, a surface acoustic wave filter of the first embodiment of this invention comprises a surface acoustic wave (SAW) resonator disposed with an inter-digital transducer (IDT) electrode and reflectors on both sides of the surface of a piezoelectric substrate. Here, three pieces of this SAW resonator form an acoustic coupling by being disposed close to each other in parallel to a propagation direction of a SAW, and the IDT electrode comprising the SAW resonator positioned in the center is totally grounded, and the IDT electrodes of the SAW resonators disposed on the outside are electrically independent.

It is preferable that the IDT electrode comprising the SAW resonator positioned in the center is grounded via electrode patterns disposed between the IDT electrodes of the SAW resonators disposed on the outside and electrodes of the reflectors.

Furthermore, it is preferable that a plurality of the filter is concatenately connected on the surface of the piezoelectric substrate through an interstage connecting electrode pattern formed thereon.

In addition, it is preferable that a part of the interstage connecting electrode pattern has an electrode pad formed for bonding.

It is preferable that the interstage connecting electrode pattern is grounded via a reactive element formed by an electrode pattern on the surface of the same piezoelectric substrate.

Furthermore, it is preferable that the reactive element is a spiral inductor.

A second embodiment of this invention is a surface acoustic wave filter comprising a SAW resonator disposed with an IDT electrode and reflectors on both sides of the surface of a piezoelectric substrate. Here, three pieces of the SAW resonator form an acoustic coupling by being disposed close to each other in parallel to a propagation direction of a SAW, and electrode patterns for bus bars disposed at two places between the adjacent SAW resonators are divided, and the IDT electrode comprising the SAW resonator positioned in the center is totally grounded.

It is preferable that an IDT electrode comprising one of the SAW resonators positioned in the outside is connected to a balanced type input terminal, and an IDT electrode comprising the other SAW resonator positioned in the outside is connected to a balanced type output terminal.

Furthermore, it is preferable that the IDT electrode comprising the SAW resonator positioned in the center is grounded via electrode patterns disposed between the IDT electrodes of the SAW resonators disposed in the outside and electrodes of the reflectors.

Also, it is preferable that a line width of the electrode patterns for bus bars comprising the IDT electrodes of the SAW resonators positioned in the outside is selected to be larger than a line width of the electrode patterns for bus bars comprising the IDT electrode of the SAW resonator positioned in the center.

It is preferable that a plurality of the filter is concatenately connected through several interstage connecting electrode patterns formed on the surface of the piezoelectric substrate.

Additionally, it is preferable that a part of the several interstage connecting electrode patterns has an electrode pad formed for bonding.

Furthermore, it is preferable that the several interstage connected electrode patterns are connected to each other via a reactive element.

It is preferable that one of the several interstage connecting electrode patterns is grounded, and the other is grounded via a reactive element.

Furthermore, it is preferable that the reactive element is a spiral inductor formed by an electrode pattern disposed on the surface of the same piezoelectric substrate.

A third embodiment of this invention is a surface acoustic wave filter comprising a SAW resonator disposed with an IDT electrode and reflectors on both sides on the surface of a piezoelectric substrate. Here, two pieces of the SAW resonator are formed in parallel to the propagation direction of a SAW, and between the SAW resonators, a periodic-structured electrode row comprising stripline electrodes having about the same length as an IDT electrode overlap width of the SAW resonator. In this instance, the stripline electrodes are disposed parallely at the same electrode period as in the SAW resonator, and the SAW resonators and the periodic electrode row form an acoustic coupling by being disposed close to each other.

It is preferable that each stripline electrode comprising the periodic electrode row is connected to each other through bus bars disposed on both edges.

Furthermore, it is preferable that the periodic-structured electrode row is grounded via electrodes disposed in an aperture between the IDT electrodes of the SAW resonators positioned in the outside and electrodes of the reflectors and further via bus bar electrodes.

In addition, it is preferable that an electrode of one SAW resonator positioned in the outside is connected to a balanced type input terminal, and an electrode of the other SAW resonator positioned in the outside is connected to a balanced type output terminal.

It is preferable that the line width of the electrode patterns for bus bars on the adjacent side of the periodic-structured electrode row of the IDT electrodes comprising the SAW resonators positioned in the outside is selected to be larger than the line width of the electrode patterns for bus bars formed on the periodic-structured electrode row.

It is also preferable that a plurality of the filter is concatenately connected through several interstage connecting electrode patterns formed on the surface of the piezoelectric substrate.

Furthermore, it is preferable that IDT electrodes on the adjacent side of the periodic-structured electrode row of the SAW resonator are integrated with bus bar electrodes which connect the periodic-structured electrode row, and that the periodic-structured electrode row is grounded.

Additionally, it is preferable that a plurality of the filter is concatenately connected through several interstage connecting electrode patterns formed on the surface of the piezoelectric substrate.

A fourth embodiment of this invention is a surface acoustic wave filter comprising a SAW resonator disposed with an IDT electrode and reflectors on both sides on the surface of a piezoelectric substrate. Here, two pieces of the SAW resonator form an acoustic coupling by being disposed close to each other, and electrodes of the SAW resonators comprising the first SAW resonator filter are arranged to be opposite in phase, and electrodes of the SAW resonators comprising the second SAW resonator filter are arranged to be equal in phase. In this instance, the first SAW resonator filter and the second SAW resonator filter are connected in parallel.

It is preferable that the first and the second SAW resonator filters are constructed in such a manner that the high band side excitation frequency of one SAW resonator filter conforms with the low band side excitation frequency of the other SAW resonator filter.

A fifth embodiment of this invention is a surface acoustic wave filter comprising a SAW resonator disposed with an IDT electrode and reflectors on both sides on the surface of a piezoelectric substrate. Here, four pieces of the SAW resonator form an acoustic coupling by being disposed close to each other, and electrodes of the SAW resonators comprising the first and the second SAW resonator filters are arranged to be opposite in phase, and electrodes of the SAW resonators comprising the third and the fourth SAW resonator filters are arranged to be equal in phase, wherein the first SAW resonator filter and the third SAW resonator filter are parallel-connected and the second and the fourth SAW resonator filters are parallel-connected. In this instance, the first and the third SAW resonator filters and the second and the fourth SAW resonator filters are concatenately connected through electrode patterns formed between the filters on the surface of the piezoelectric substrate.

It is also preferable that the first and the third SAW resonator filters are constructed in such a manner that the high band side excitation frequency of one SAW resonator filter conforms with the low band side excitation frequency of the other SAW resonator filter, and the second and the fourth SAW resonator filters are constructed in such a manner that the high band side excitation frequency of one SAW resonator filter conforms with the low band side excitation frequency.

In addition, it is preferable that the first SAW resonator filter and the second SAW resonator filter are positioned next to each other in parallel to the propagation direction of the surface acoustic wave, and the third SAW resonator filter and the fourth SAW resonator filter are positioned next to each other in parallel to the propagation direction of the surface acoustic wave.

A sixth embodiment of this invention is a surface acoustic wave filter comprising a SAW resonator disposed with an IDT electrode and reflectors on both sides on the surface of a piezoelectric substrate which forms an acoustic coupling by being disposed close to each other. Here, electrode patterns for bus bars are divided at the central part of an adjacent IDT electrode in the SAW resonator filter, and a plurality of the SAW resonator disposed has electrically independent bus bars.

It is preferable that two pieces of SAW filter are formed on the same piezoelectric substrate, and an electrode of the SAW resonator comprising the first SAW resonator filter is arranged to be opposite in phase, and an electrode of the SAW resonator comprising the second SAW resonator filter is arranged to be equal in phase. Here, the first SAW resonator filter and the second SAW resonator filter are parallel-connected.

Furthermore, it is preferable that the first and the second SAW resonator filters are constructed in such a manner that the high band side excitation frequency of one SAW resonator filter conforms with the low band side excitation frequency of the other SAW resonator filter.

A seventh embodiment of this invention is a surface acoustic wave filter comprising a SAW resonator disposed with an IDT electrode and reflectors on both sides on the surface of a piezoelectric substrate which forms an acoustic coupling by being disposed close to each other. Here, electrode patterns for bus bars are divided at the central part of the SAW resonator filter, and four pieces of the SAW resonator filters were formed such that electrodes of the SAW resonators comprising the first and the second SAW resonator filter are arranged to be opposite in phase, and electrodes of the SAW resonators comprising the third and the fourth SAW resonator filter are arranged to be equal in phase. The first SAW resonator filter and the third SAW resonator filters are parallel-connected and the second and the fourth SAW resonator filters are parallel-connected. In this instance, the first and the third SAW resonator filters are concatenately connected to the second and the fourth SAW resonator filters through electrode patterns formed between the filters on the surface of the piezoelectric substrate.

It is preferable that the first and the third SAW resonator filters are constructed in such a manner that the high band side excitation frequency of one SAW resonator filter conforms with the low band side excitation frequency of the other SAW resonator filter. Then, the second and the fourth SAW resonator filters are constructed in such a manner that the high band side excitation frequency of one SAW resonator filter conforms with the low band side excitation frequency of the other SAW resonator filter.

An eighth embodiment of this invention is a surface acoustic wave filter comprising a reactive element formed by using a part of electrode patterns of the SAW filter.

It is also preferable that the surface acoustic wave filter comprises a reactive element disposed with an IDT electrode and reflector electrodes and is formed by using the reflector electrodes.

In addition, it is preferable that the reactive element is an inductor formed by connecting parallel-positioned stripline electrodes comprising the reflector electrodes in a zigzag pattern.

Furthermore, it is preferable that the reactive element is an inductor formed by bundling and connecting a plurality of parallel-positioned stripline electrodes comprising the reflector electrodes in a zigzag pattern.

It is preferable that the reactive element is a capacitor formed by connecting parallel-positioned stripline electrodes comprising the reflector electrodes in an inter-digital form.

It is also preferable that the reactive element is used to form an input-output matching circuit.

Additionally, it is preferable that the reactive element is used to form an interstage matching circuit.

It is preferable that a plurality of SAW resonator comprising an IDT electrode and reflectors on both sides forms an acoustic coupling by being disposed close to each other.

Furthermore, it is preferable that the reactive element is formed by using a reflector electrode.

A ninth embodiment of this invention is a surface acoustic wave filter comprising a SAW resonator disposed with an IDT electrode and reflectors on both sides. Here, a plurality of the SAW resonator forming an acoustic coupling by being disposed close to each other are formed on the surface of the same piezoelectric substrate, and the SAW resonator filters are concatenately connected, and an input-output matching circuit is formed by using a reactive element formed by an electrode pattern disposed on the surface of the piezoelectric substrate.

It is preferable that the reactive element is formed by using reflector electrodes.

A tenth embodiment of this invention is a surface acoustic wave filter comprising a SAW resonator disposed with an IDT electrode and reflectors on both sides. Here, a plurality of the SAW resonator forming an acoustic coupling by being disposed close to each other are formed on the surface of the same piezoelectric substrate, and the SAW resonator filters are concatenately connected, and the connecting points are grounded via a reactive element formed by an electrode pattern disposed on the surface of the same piezoelectric substrate.

It is preferable that the reactive element is a spiral inductor.

Furthermore, it is preferable that the spiral inductor is formed by using an aperture between the plurality of SAW filters.

It is also preferable that a short-circuit electrode pattern for a short-circuit connection between the winding electrode patterns adjacent to the spiral inductor is disposed at least at one place.

According to the first embodiment of this invention, three pieces of a SAW resonator disposed with an inter-digital transducer (IDT) electrode and reflectors on both sides on the surface of a piezoelectric substrate form an acoustic coupling by being disposed close to each other in parallel to the propagation direction of a SAW, and the IDT electrode comprising the SAW resonator positioned in the center is totally grounded, and furthermore, the IDT electrodes of the SAW resonators disposed in the outside are electrically independent. Since the potential of the SAW resonator positioned in the center can be distributed freely, and potential between the SAW resonators disposed in the outside is not canceled, a strong vibration strength can be obtained as well with respect to the second-order mode. As a result, a SAW filter using three excitation modes can be constructed, and this filter can achieve broader pass band characteristics than the conventional SAW filter with two excitation modes without using an external elongation coil etc. Additionally, the SAW filter using three excitation modes is attained here, so that this filter has steeper out-of-band rejection factor than that of the conventional SAW filter in the second-order mode. Thus, better selectivity characteristics can be obtained as well.

Furthermore, according to the first embodiment, it is preferable that the IDT electrode comprising the SAW resonator positioned in the center is grounded via electrode patterns disposed in an aperture between the IDT electrodes of the SAW resonators disposed in the outside and electrodes of the reflectors. Thus, the distance between the IDT electrode and the reflector comprising the SAW filter can be determined with greater freedom. Therefore, the out-of-band interference can be suppressed by suitably selecting the distance between the IDT electrode and the reflector. As a result, better out-of-band characteristics can be obtained in this way.

In addition, it is preferable that a plurality of the filter is concatenately connected through an interstage connecting electrode pattern formed on the surface of the piezoelectric substrate. Accordingly, the out-of-band rejection characteristics can be improved considerably, so even better filter characteristics can be obtained. Here, when an electrode pad for bonding is formed at a part of the interstage connecting electrode pattern, the connection between the interstage connecting electrode pattern and an external circuit can be simplified for obtaining good pass characteristics by connecting a matching element such as an inductor to the interstage connecting pattern. In this instance, it is also preferable that the interstage connecting electrode pattern is grounded via a reactive element formed by an electrode pattern disposed on the same surface of the piezoelectric substrate. Thus, an external circuit is no longer needed so that a compact-sized filter circuit can be attained. Furthermore, when this reactive element is a spiral inductor, the reactive element can be miniatuarized.

According to the second embodiment of this invention, a surface acoustic wave filter comprises a SAW resonator disposed with an IDT electrode and reflectors on both sides on the surface of a piezoelectric substrate, and three pieces of the SAW resonator form an acoustic coupling by being disposed close to each other in parallel to the propagation direction of a SAW, and electrode patterns for bus bars disposed at two places between the adjacent SAW resonators are divided, and the IDT electrode comprising the SAW resonator positioned in the center is totally grounded. Thus, the bus bars in the central part of the IDT electrode can become electrically independent, and all the IDT electrodes of the SAW filters disposed in the outside can be wired independently. Therefore, among the IDT electrodes comprising the SAW filter, only the IDT electrode of the SAW resonator positioned in the center is grounded, so that input-output terminals can become electrically independent at this part. As a result, input-output characteristics of the filter are not directly affected by how the IDT electrodes are grounded, and furthermore, since direct components of signals between the input-output terminals decrease considerably, out-of-band rejection characteristics of the filter can be improved even more.

Also, it is preferable that an IDT electrode comprising one of the SAW resonators positioned in the outside is connected to a balanced type input terminal, and an IDT electrode comprising the other SAW resonator positioned in the outside is connected to a balanced type output terminal. Accordingly, a balanced type element such as an integrated circuit (IC) comprising differential if-amplifiers, for example, can be electrically connected upstream and downstream to the filter without using an outside circuit of balun or the like. In this way, noise characteristics of the whole circuit can be improved. In this instance, when the line width of the electrode patterns for bus bars comprising the IDT electrodes of the SAW resonators positioned in the outside is selected to be larger than a line width of the electrode patterns for bus bars comprising the IDT electrode of the SAW resonator positioned in the center, insertion loss of the filter can be improved. The reason is as follows. G, the distance between the comb-formed electrodes comprising the IDT electrodes of the adjacent SAW resonators, controls the coupling degree of the two SAW resonators. The smaller this distance is, the stronger the coupling degree between the SAW resonators becomes, which is preferable for attaining a broader band. If G becomes too small, however, widths W1 and W2 of the bus bar electrodes disposed in this part become smaller, so that the electrical resistance loss of the IDT electrodes in this part affects the insertion loss of the filter considerably. Here, the bus bar electrode disposed in the outside (line width W1) is directly connected to one of the balanced input-output terminals, but the bus bar electrode disposed in the central part (line width W2) is used for grounding the IDT electrode comprising the SAW resonator in the center. Thus, they are not electrically connected to the input-output terminals. In other words, line width W2 of the bus bar electrode positioned in the center does not affect the insertion loss of the filter at all. Therefore, when line width W2 of the bus bar electrode positioned in the center is selected to be smaller, line width W1 of the bus bar electrode disposed in the outside can be selected to be larger for compensation. As a result, the electrical resistance loss into the input-output terminals can be reduced without changing the distance G between the comb-formed electrodes comprising the IDT electrodes of the adjacent SAW resonators. In this way, the insertion loss of the filter can be improved.

Furthermore, according to the second embodiment, it is preferable that the IDT electrode comprising the SAW resonator positioned in the center is grounded via electrode patterns disposed between the IDT electrodes of the SAW resonators disposed in the outside and the reflector electrodes, the distance between the IDT electrode and the reflectors comprising the SAW filter can be determined with greater freedom. Thus, the out-of-band interference can be suppressed by suitably selecting the distance between the IDT electrode and the reflectors. As a result, better out-of-band characteristics can be obtained.

Also, it is preferable that a plurality of the filter is concatenately connected through several interstage connecting electrode patterns formed on the surface of the piezoelectric substrate. Accordingly, out-of-band rejection characteristics can be improved considerably so that even better filter characteristics can be obtained. Here, it is preferable that a part of the several interstage connecting electrode patterns is formed with an electrode pad for bonding. When good pass characteristics are obtained by connecting a matching element such as an inductor to the interstage connecting electrode patterns, the connection between the interstage connecting electrode patterns and an external circuit is simplified. In this instance, it is preferable that the several interstage connecting electrode patterns are connected to each other via a reactive element for obtaining good pass characteristics. Also, it is preferable that one of the several interstage connecting electrode patterns is grounded, and another is grounded via a reactive element for obtaining good pass characteristics. Furthermore, it is preferable that the reactive element is a spiral inductor formed by an electrode pattern disposed on the surface of the same piezoelectric substrate for obtaining a reactive element having a compact size.

According to the third embodiment of this invention, a surface acoustic wave filter comprises a SAW resonator disposed with an IDT electrode and reflectors on both sides of the surface of a piezoelectric substrate, and two parts of the SAW resonator are formed in parallel to a propagation direction of a surface acoustic wave, and between the SAW resonators, a periodic-structured electrode row is formed comprising stripline electrodes having about the same length as an IDT electrode overlap width of the SAW resonator which are parallel-disposed at the same electrode period as of the SAW resonator, and the SAW resonators and the periodic-structured electrode row form an acoustic coupling by being disposed close to each other. Therefore, even if the electrode structure of the SAW resonator positioned in the center is changed from the IDT electrode to the periodic-structured stripline electrode row, when the electrode cycle is the same, the surface acoustic wave can be propagated as in the first embodiment. As a result, a broader band of the SAW filter can be attained.

Furthermore, it is preferable in this embodiment that each stripline electrode comprising the periodic-structured electrode row is connected to each other through bus bars disposed on both edges of the electrode row. Accordingly, the periodic-structured electrode row can be structured as the reflector. In addition, it is preferable that the IDT electrode on the side adjacent to the periodic-structured electrode row of the SAW resonator and the bus bar electrode connecting the periodic-structured electrode row are combined into one, and that the periodic-structured electrode row is grounded. As a result, this structure can attain an unbalanced input-output as in the above-noted first embodiment, and also, a broader band of the SAW filter can be attained.

When a plurality of this filter is concatenately connected via interstage connecting electrode patterns formed on the surface of the piezoelectric substrate, the out-of-band rejection characteristics can be improved considerably so that good filter characteristics can be obtained. Here, it is preferable that the periodic-structured electrode row is grounded via electrodes disposed in an aperture between the IDT electrodes of the SAW resonators positioned in the outside and via bus bar electrodes. Accordingly, the periodic-structured electrodes become electrically independent from the input-output terminals. As a result, input-output characteristics of the filter are not affected by how the periodic-structured electrodes are grounded, and furthermore, direct components of signals between the input-output terminals decrease considerably. Thus, the out-of-band rejection characteristics of the filter can be improved even more, as in the above-mentioned second embodiment. Also, since the distance between the IDT electrode as well as the periodic-structured electrode and the reflectors comprising the SAW resonator can be determined with greater freedom, the out-of-band interference can be suppressed by suitably selecting the distance between the IDT electrode as well as the periodic-structured electrode and the reflectors. As a result, better out-of-band characteristics can be obtained in this way.

According to this embodiment, it is preferable that an electrode of one SAW resonator positioned in the outside is connected to a balanced type input terminal and an electrode of the other SAW resonator positioned in the outside is connected to a balanced type output terminal. As a result, a balanced type element such as an IC can be connected upstream and downstream to the filter without using an external circuit of balun or the like so that noise characteristics of the whole circuit are improved as well. Furthermore, when a line width of the electrode patterns for bus bars formed on the adjacent side of the periodic-structured electrode of the IDT electrodes comprising the SAW resonators positioned in the outside is selected to be larger than a line width of the electrode patterns for bus bars formed on the periodic-structured electrode row, insertion loss of the filter can be improved even more, as in the above-noted second embodiment. This is due to the fact that when compared with the second embodiment, a portion of the part where no electrode is present decreases in G which is the distance between the comb-formed electrodes comprising the IDT electrodes of the SAW resonators disposed in the outside and the periodic-structured electrode disposed in the center. Instead, the line width W1 of the electrode pattern for the bus bar on the side adjacent to the periodic-structured electrode of the IDT electrode comprising the SAW resonator disposed in the outside can be enlarged.

Additionally, it is preferable in this embodiment that a plurality of the filter is concatenately connected through several interstage connecting electrode patterns formed on the surface of the piezoelectric substrate. As a result, out-of-band rejection characteristics can be improved considerably, and better filter characteristics can be obtained.

According to the fourth embodiment of this invention, two portions of the SAW resonator disposed with an IDT electrode and reflectors on both sides forming an acoustic coupling by being disposed close to each other are formed on the surface of a piezoelectric substrate, and electrodes of the SAW resonators comprising the first SAW resonator filter are arranged to be opposite in phase, and electrodes of the SAW resonators comprising the second SAW resonator filter are arranged to be equal in phase, and the first SAW resonator filter is connected parallel to the second SAW resonator filter. As a result, the band width can be broadened without deteriorating the pass characteristics of the band. This is because a single SAW resonator filter has two excitation frequencies of either $f_1$ and $f_2$ ($f_1 < f_2$) or $f_3$ and $f_4$ ($f_3 < f_4$), and the phase relationship between these two frequencies is opposite. Therefore, according to this embodiment, the electrodes of the SAW resonator comprising the first SAW resonator filter are arranged to be opposite in phase, and the electrodes of the SAW resonator comprising the second SAW resonator filter are arranged to be equal in phase, and the first SAW resonator filter is connected parallel to the second SAW resonator filter. Thus, the phase relationship between $f_1$ and $f_2$ as well as the phase relationship between $f_3$ and $f_4$ can be reversed. In other words, $f_2$ and $f_3$ become equal in phase. As a result, by conforming the excitation frequencies of $f_2$ and $f_3$, a band width can be broadened without deteriorating the pass characteristics of the band.

According to the fifth embodiment of this invention, four parts of a SAW resonator disposed with an IDT electrode and reflectors on both sides forming an acoustic coupling by being disposed close to each other are formed on the surface of a piezoelectric substrate, and electrodes of the SAW resonators comprising the first and the second SAW resonator filters are arranged to be opposite in phase, and electrodes of the SAW resonators comprising the third and the fourth SAW resonator filters are arranged to be equal in phase, and the first SAW resonator filter is connected parallel to the third SAW resonator filter and the second SAW resonator filter is connected parallel to the fourth SAW resonator filter, and the first and the third SAW resonator filters and the second and the fourth SAW resonator filters are concatenately connected through electrode patterns formed between the filters on the surface of the piezoelectric substrate. As a result, two pairs of the parallel-connected SAW resonators are operated respectively in the same manner as in the first embodiment. By concatenately connecting these resonators, the out-of-band rejection can be improved even more.

Furthermore, it is preferable in this embodiment that the first and the third SAW resonator filters are constructed in such a manner that the high band side excitation frequency of one SAW resonator filter conforms with the low band side excitation frequency of the other SAW resonator filter, and that the second and the fourth SAW resonator filters are constructed in such a manner that the high band side excitation frequency of one SAW resonator filter conforms with the low band side excitation frequency of the other SAW resonator filter. As a result, band width can be broadened without deteriorating the pass characteristics of the band, as in the fourth embodiment.

In addition, it is preferable that the first SAW resonator filter and the second SAW resonator filter are positioned next to each other in parallel to the propagation direction of the surface acoustic wave, and the third SAW resonator filter and the fourth SAW resonator filter are positioned next to each other in parallel to a propagation direction of the surface acoustic wave. Accordingly, undesired stray capacitance can be eliminated between the concatenately connected multistage connected SAW filters, and therefore, an interstage matching circuit is no longer necessary. As a result, the circuit can be compact-sized, while stable characteristics of the filter can be achieved.

According to the sixth embodiment of the invention, a SAW resonator disposed with an IDT electrode and reflectors on both sides on the surface of a piezoelectric substrate forms acoustic coupling by being disposed close to each other, and electrode patterns for bus bars are divided at the central part of an IDT electrode adjacent to the SAW resonator filter, and a plurality of the SAW resonator disposed closely has electrically independent bus bars. Thus, ground electrodes of the input IDT electrode and the output IDT electrode can be taken out independently, and a balanced input-output of the SAW filter can be achieved. As a result, since the IDT electrodes of the SAW filter are no longer needed to be grounded, the input-output characteristics of the filter are not directly affected by how the SAW electrodes are grounded. Furthermore, since direct components of signals between the input-output terminals decrease considerably, the out-of-band rejection characteristics of the filter can be improved. Also, a balanced type element such as IC can be connected upstream and downstream to the filter without using an external circuit of balun etc. so that noise characteristics of the whole circuit are improved as well.

Furthermore, it is preferable that two pieces of the SAW filter are formed on the same piezoelectric substrate, and electrodes of the SAW resonator comprising the first SAW resonator filter are arranged to be opposite in phase, and electrodes of the SAW resonator comprising the second SAW resonator filter are arranged to be equal in phase, and the first SAW resonator filter and the second SAW resonator filter are parallel-connected. Thus, the band width can be broadened without deteriorating the pass characteristics of the band as in the fourth embodiment.

According to the seventh embodiment of this invention, a surface acoustic wave filter comprises a SAW resonator disposed with an IDT electrode and reflectors on both sides on the surface of a piezoelectric substrate forming acoustic coupling by being disposed close to each other, and electrode patterns for bus bars are divided at the central part of the SAW resonator filter, and four pieces of the SAW resonator filters are formed in such a manner that electrodes of the SAW resonators comprising the first and the second SAW resonator filter are arranged to be opposite in phase, and electrodes of the SAW resonators comprising the third and the fourth SAW resonator filter are arranged to be equal in phase, and the first SAW resonator filter is parallel-connected to the third SAW resonator filter and the second SAW resonator filter is connected parallel to the fourth SAW resonator filter, and the first and the third SAW resonator filters are concatenately connected to the second and the fourth SAW resonator filters through electrode patterns formed between the filters on the surface of the piezoelectric substrate. Thus, two pairs of parallel-connected SAW resonator filters are operated in the same manner as in the above-noted sixth embodiment. By concatenately connecting these filter, the out-of-band rejection can be improved even more.

According to the eighth embodiment of this invention, a reactive element is formed by using a part of electrode patterns comprising the SAW filter. In this way, it is not necessary to add a separate electrode area so that the above-noted circuit structure can be achieved with about the same piezoelectric substrate area as in a conventional SAW filter.

It is also preferable that the surface acoustic wave filter disposed with an IDT electrode and reflector electrodes comprises a reactive element formed by using the reflector electrodes. In this way, differences in element values when compared with using an exterior circuit element can be reduced, so circuit characteristics of the SAW filter can be stabilized. Here, it is preferable that the reactive element is an inductor formed by connecting parallel-positioned stripline electrodes comprising the reflector electrodes in a zigzag pattern for attaining a compact-sized reactive element. Furthermore, it is preferable that the reactive element is an inductor formed by bundling and connecting a plurality of parallel-positioned stripline electrodes comprising the reflector electrodes in a zigzag pattern. As a result, the resistance component of the inductor can be reduced, so deterioration of filter characteristics can be prevented. It is also preferable that the reactive element is a capacitor formed by connecting parallel-positioned stripline electrodes comprising the reflector electrodes in an inter-digital form. In this way, the reactive value can be finely adjusted by trimming the electrode patterns.

It is also preferable that the reactive element is used to form an input-output matching circuit or to form an interstage matching circuit. Accordingly, the reactive electrode patterns serve as matching circuits for the SAW filter, and as a result, it is no longer necessary to install an exterior matching circuit. Thus, a number of components can be reduced to attain a compact circuit as a whole.

Additionally, it is preferable that a plurality of the SAW resonator comprising an IDT electrode and reflectors on both sides forms an acoustic coupling by being disposed close to each other. In this way, an energy trapping type SAW resonator filter can be attained with about the same piezoelectric substrate area as in the conventional filter. Furthermore, it is preferable that the reactive element is formed by using a reflector electrode for reducing differences in element values when compared with the case using an exterior circuit element. Thus, the circuit characteristics of the SAW filter can be stabilized.

According to the ninth embodiment, a plurality of a SAW resonator disposed with an IDT electrode and reflectors on both sides forming an acoustic coupling by being disposed close to each other is formed on the surface of the same piezoelectric substrate, and the SAW resonator filters are concatenately connected, and input-output matching circuits are formed by using a reactive element formed by an electrode pattern disposed on the surface of the piezoelectric substrate. Thus, differences in element values can be reduced when compared with the case using an exterior circuit element, so that circuit characteristics of the multistage connected SAW filter can be stabilized.

According to the tenth embodiment of this invention, a SAW resonator filter comprises a plurality of SAW resonators disposed with an IDT electrode and reflectors on both sides forming an acoustic coupling by being disposed close to each other, and a plurality of the SAW filter is formed on the surface of the same piezoelectric substrate, and the above-noted SAW resonator filters are concatenately connected, and the connecting points are grounded via reactive elements formed by electrode patterns disposed on the surface of the same piezoelectric substrate. In this way, the reactive elements formed by the electrode patterns on the surface of the piezoelectric substrate serve as interstage matching elements for the filter. In this way, an interstage unadjustment of the SAW filter can be achieved without increasing the electrode area on the surface of the piezoelectric substrate. It is no longer necessary to connect an adjustment circuit such as an elongation coil at the interstage of, e.g., a broadband type transversely coupled resonator type SAW filter.

According to the tenth embodiment, it is preferable that the reactive element is a spiral inductor for attaining a small-sized reactive element. It is also preferable that the spiral inductor is formed by using an aperture between the plurality of SAW filters. In this way, it is unnecessary to enlarge the piezoelectric substrate more than the conventional one, so the circuit can be miniaturized. Furthermore, when a short-circuit electrode pattern is formed at least at one part for a short-circuit connection of winding electrode patterns adjacent to the spiral inductor, the reactive value can be finely controlled by trimming the short-circuit electrode pattern by means of a laser or the like. As a result, the filter characteristics can be finely controlled after the SAW filter substrate is mounted to the package.

BRIEF DESCRIPTION OF THE DRAWINGS

FIG. 2 (b) is a diagram explaining the distribution of vibration mode patterns during an operation of a surface acoustic wave filter of a first embodiment of this invention.

DETAIL DESCRIPTION OF THIS INVENTION

The invention will be explained in detail with reference to the attached figures and the following examples. The examples are illustrative and should not be construed as limiting the invention in any way.

EXAMPLE 1

Figure 1:
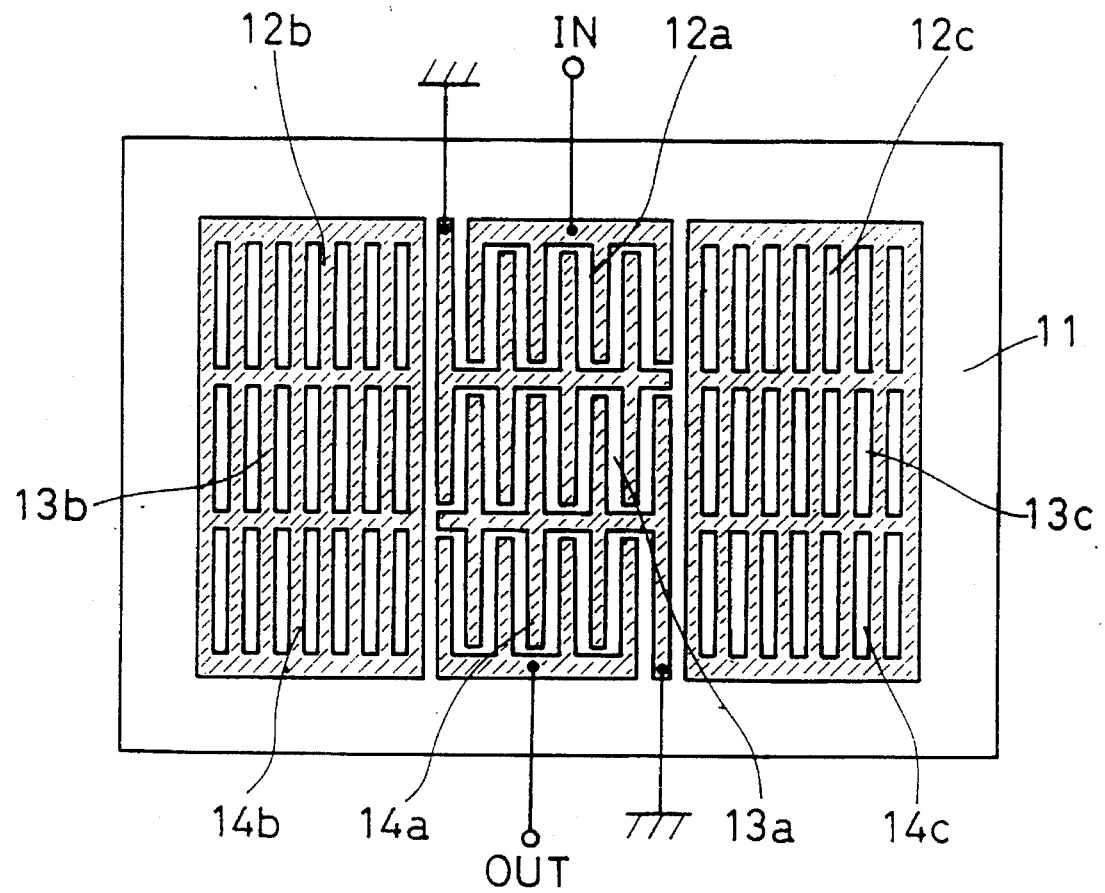
FIG. 1 is a schematic view of a surface acoustic wave filter of a first embodiment of this invention.

FIG. 1 shows a schematic view of a surface acoustic wave filter of a first embodiment. Referring to FIG. 1, reference numeral 11 represents a monocrystal piezoelectric substrate. By forming periodic-structured stripline electrode patterns on the surface of piezoelectric substrate 11, a surface acoustic wave can be generated. On the surface of piezoelectric substrate 11, there is a first energy trapping type SAW resonator formed by an IDT electrode 12a and reflectors 12b, 12c. Also on the same piezoelectric substrate 11, there are formed a second SAW resonator comprising an IDT electrode 13a and reflectors 13b, 13c together with a third SAW resonator comprising an IDT electrode 14a and reflectors 14b, 14c in the same manner. The three SAW resonators mentioned above are closely disposed to each other, and the adjacent IDT electrodes and the adjacent electrodes of reflectors are connected through common bus bars. In addition, an outside electrode finger of IDT electrode 12a is connected to an input terminal, while an outside electrode finger of IDT electrode 14a is connected to an output terminal. Furthermore, one electrode finger of IDT electrode 13a is grounded together with an inside electrode finger of IDT electrode 12a via an electrode pattern disposed between the common bus bar and an aperture of IDT electrode 12a and reflector 12b. The other electrode finger of 13a is grounded together with an inside electrode finger of IDT electrode 14a via an electrode pattern disposed between the common bus bar and an aperture of IDT electrode 14a and reflector 14c.

Next, the surface acoustic wave filter constructed in the above manner will be explained with regard to its operation.

Figure 2:
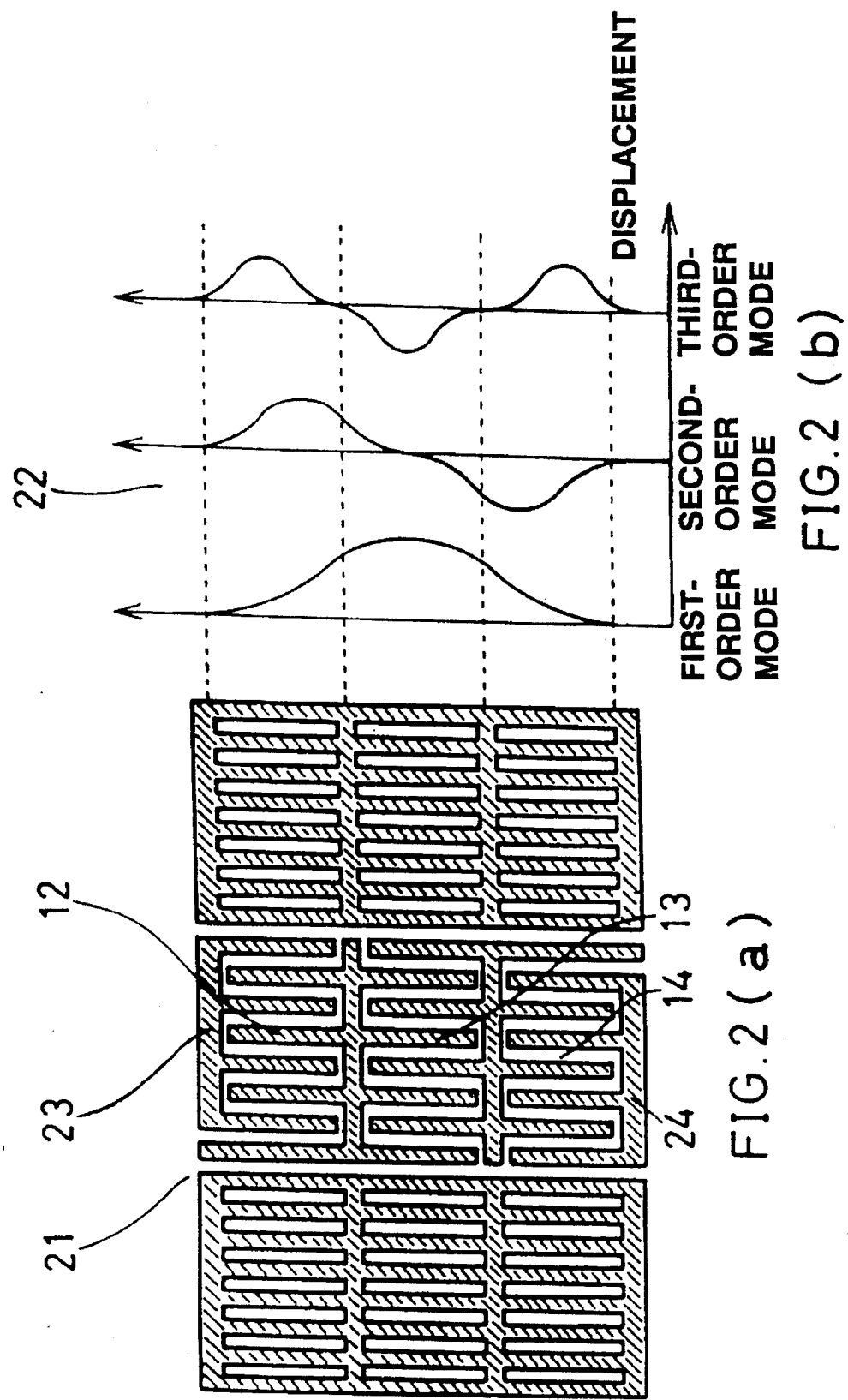
FIG. 2 (a) is the same schematic view of a surface acoustic wave filter as in FIG. 1.
Figure 3:
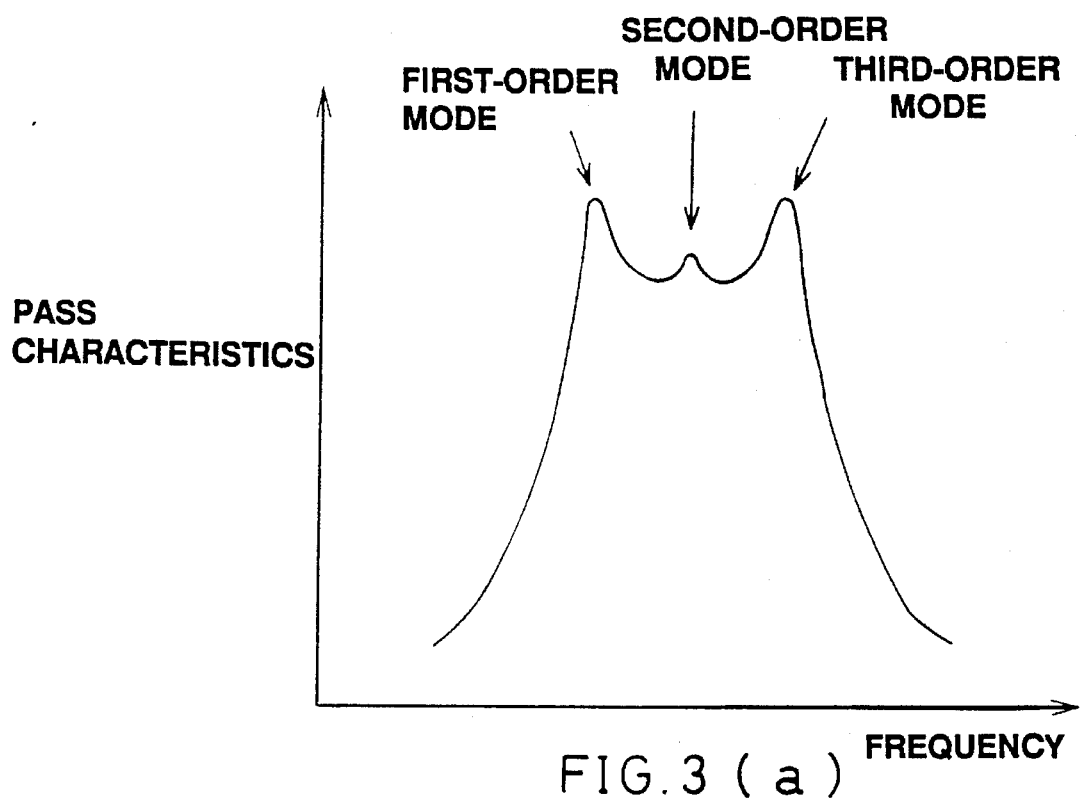
FIG. 3 (a) and (b) are graphs showing pass band characteristics during operations of a surface acoustic wave filter of a first embodiment of this invention.
Figure 3:
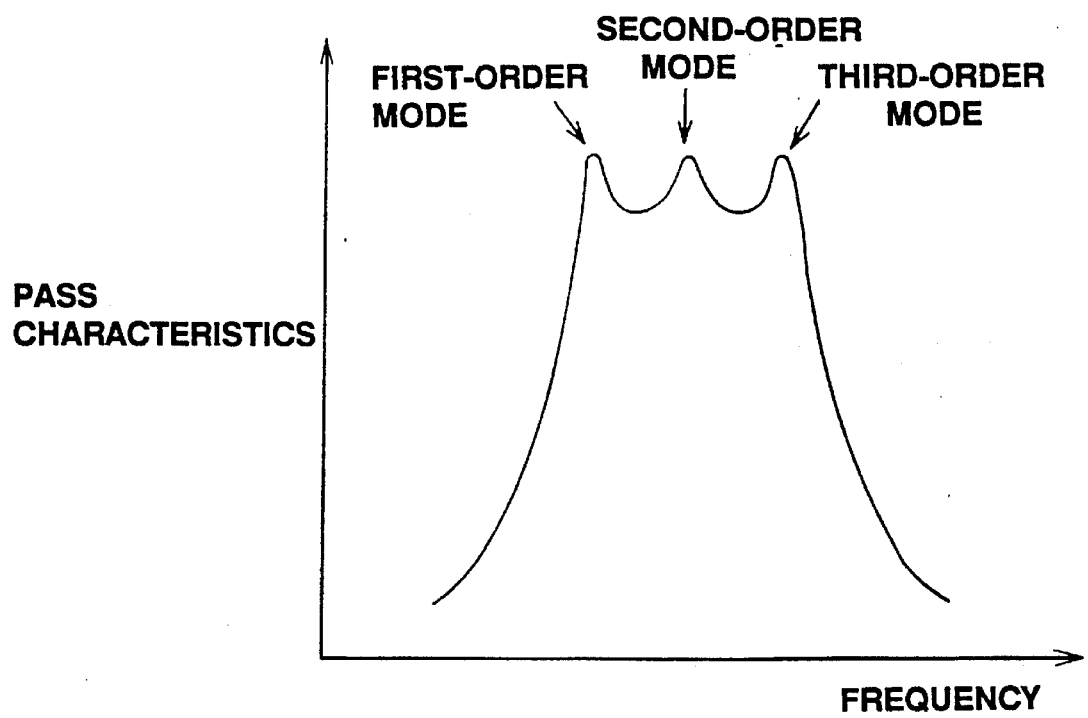

FIG. 2 (a) is a diagram showing vibration mode patterns of a surface acoustic wave filter of this embodiment. The same reference numerals are given to the corresponding parts of FIG. 1. In FIG. 2 (a), 21 is an electrode structure of the SAW filter shown in FIG. 1, and an acoustic coupling occurs between SAW resonators 12, 13, and 14 when they are disposed closely to each other. At this time, modes in first-order, second-order, and third-order with potential distributions shown as 22 are generated as shown in FIG. 2 (b). In this instance, the second-order mode falls on a part where a node of the mode distribution crosses with the IDT electrode of SAW resonator 13 disposed in the middle, and a polarity of the potential distribution changes at its upper and lower sides. Therefore, when the electrode pattern is only constructed as 21, vibration strength in the second-order mode becomes considerably weaker than the first-order and third-order modes. Pass band characteristics of this filter at direct-coupled 50 Ω show a depression in the center as shown in FIG. 3 (a). When the frequency difference between the first-order mode and the third-order mode is designed to be broad in band which exceeds 0.1% in a normalized state through a center frequency, the band will not be flat within even with a matching circuit, so that filter characteristics are not satisfactory. Therefore, in order to obtain good filter characteristics in the electrode structure shown in FIG. 1, the second-order mode needs to be vibrated strongly for using it for pass characteristics. For this purpose, it is necessary that the potential of SAW resonator 13 disposed in the center can be distributed freely, and that potential between SAW resonators 12 and 14 in the outside is not canceled. In this embodiment, IDT electrodes of SAW resonator 13 are both grounded, and IDT electrode fingers 23 and 24 shown in FIG. 2 (a) are respectively connected to an input terminal and an output terminal and are electrically independent. Accordingly, this embodiment satisfies the above-mentioned requirements. Here, the pass band characteristics at direct-coupled 50 Ω are shown in FIG. 3 (b) which indicates that a strong vibration strength with regard to the second-order mode can be obtained. As a result, a SAW filter using three excitation modes can be constructed, and this filter can achieve broader pass band characteristics than the conventional SAW filter using two excitation modes.

Furthermore, the distance between the IDT electrode and the reflector of a SAW filter influences the strength in out-of-band interference so that the interference can be suppressed by selecting the size suitably. In this embodiment, by disposing the electrode pattern for grounding the IDT electrode of the central SAW resonator in this part, the distance can be determined with greater freedom, the out-of-band interference is suppressed, and better out-of-band characteristics can be obtained.

Additionally, the SAW filter of this embodiment makes use of three excitation modes, so that the filter becomes third-order. As a result, this filter has steeper out-of-band shape factor than that of the conventional SAW filter of second-order, thereby obtaining better selectivity characteristics.

According to the above-mentioned embodiment, the band of the SAW filter can be broadened without using an external elongation coil etc. by closely disposing three pieces of SAW resonators and grounding all of the IDT electrodes comprising the SAW resonator in the center.

Figure 4:
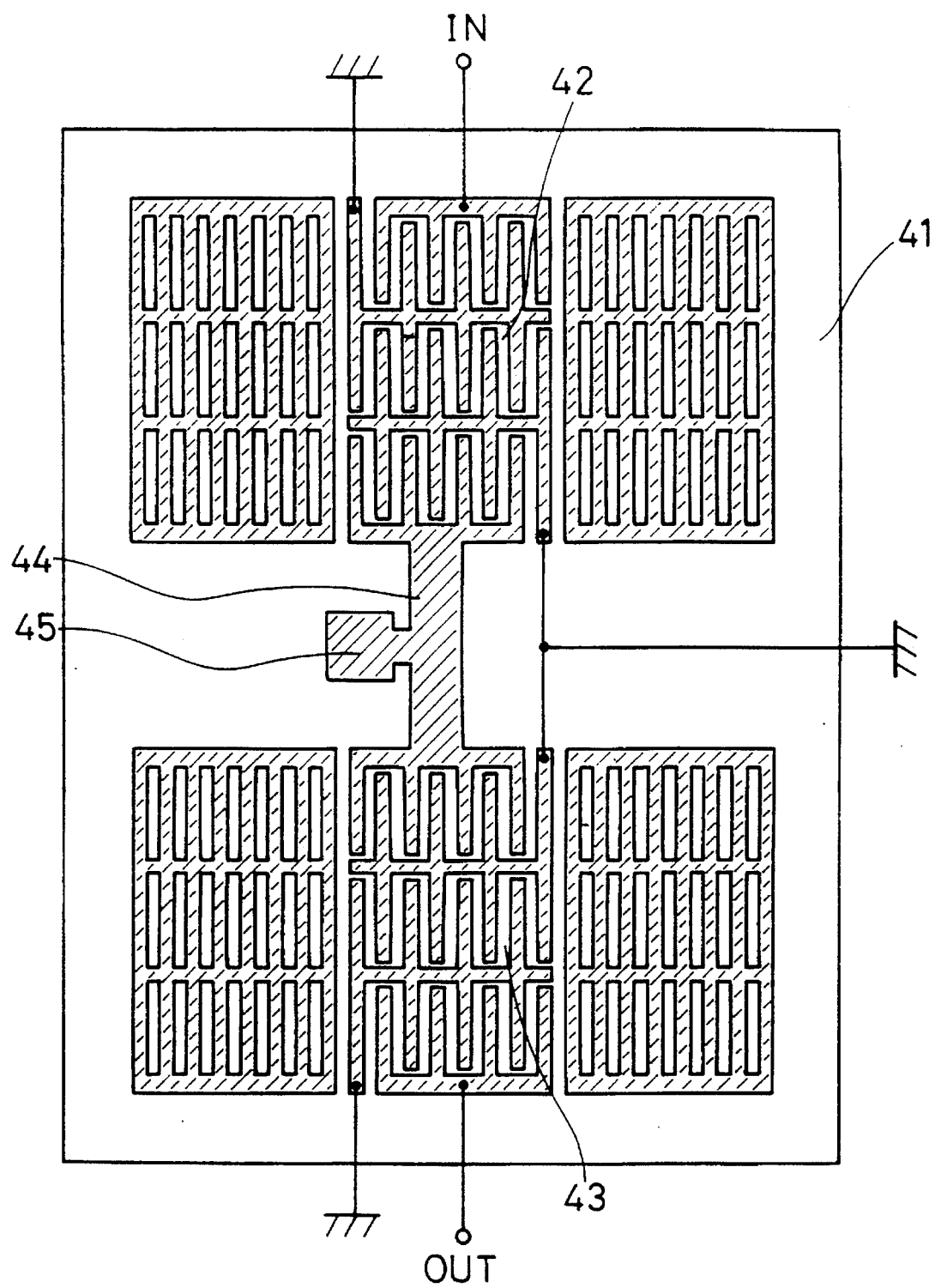
FIG. 4 is a schematic view of a multistage connected surface acoustic wave filter of a first embodiment of this invention.

Furthermore, this embodiment referred only to a SAW filter having a one stage structure, but as shown in FIG. 4, a plurality of SAW filters 42 and 43 can be concatenately connected on the surface of the same piezoelectric substrate 41 to form a multistage connected SAW filter. In this case, even though the insertion loss increases slightly, the out-of-band rejection characteristics can be improved considerably, so even better filter characteristics can be obtained.

Also, input-output impedance of a SAW filter is controlled by a number of IDT pairs of a SAW resonator and can not be determined optionally. Therefore, when the filter is simply concatenately connected, pass characteristics are not always satisfactory due to a mismatching connection. In this case, an electrode pattern 44 which is interstage concatenately connected should be connected to a matching element such as an inductance. Here, connection with an external circuit is simplified when an electrode pad 45 for bonding is disposed to electrode pattern 44. Or, by forming a reactive element such as a spiral inductor on the same piezoelectric substrate and by connecting one end to electrode pattern 44 while grounding the other end, an external circuit is no longer needed so that a compact-sized filter circuit can be attained.

This embodiment referred to a description of three SAW resonators disposed closely to each other. Theoretically, this number can be increased to four or more for constructing a filter using a more high-order mode. However, an increased number of resonator complicates the filter design, and element sensitivity of the matching circuit rises. Therefore, filter characteristics are no longer satisfactory. Thus, it is preferable to select three pieces of SAW resonators which are closely disposed.

EXAMPLE 2

Figure 5:
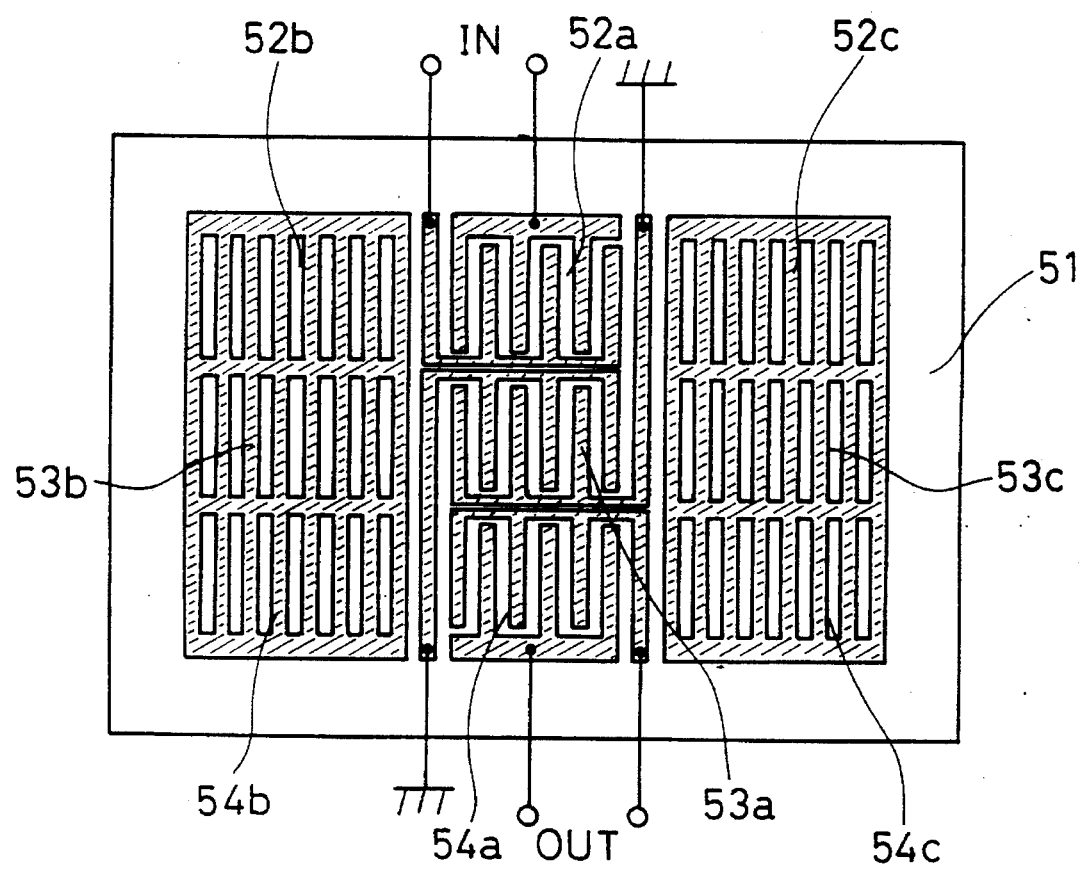
FIG. 5 is a schematic view of a surface acoustic wave filter of a second embodiment of this invention.

FIG. 5 is a schematic view of a surface acoustic wave filter of a second embodiment of this invention. Referring to FIG. 5, a first SAW resonator is formed by disposing an IDT electrode 52a and reflectors 52b, 52c on the surface of a monocrystal piezoelectric substrate 51. Also, on the surface of piezoelectric substrate 51, a second SAW resonator is formed comprising an IDT electrode 53a and reflectors 53b, 53c as well as a third SAW resonator comprising an IDT electrode 54a and reflectors 54b, 54c. The three SAW resonators mentioned above are disposed close to each other. Furthermore, one electrode finger of IDT electrode 53a is grounded between IDT electrode 52a and reflector 52b via an electrode pattern disposed in an aperture, while the other electrode finger is grounded between IDT electrode 54a and reflector 54c via an electrode pattern disposed in an aperture. The above-mentioned structure is identical with that of the first embodiment shown in FIG. 1.

This figure differs from FIG. 1 in that adjacent bus bar electrodes of IDT electrodes comprising the SAW resonators are electrically independent. In addition, the electrode finger of IDT electrode 52a is connected to a balanced type input terminal, whereas the electrode finger of IDT electrode 54a is connected to a balanced type output terminal.

The operation of the surface acoustic wave filter constructed above is basically the same with that of the first embodiment shown in FIG. 2. Thus, a broader band of the SAW filter can be achieved, and out-of-band interference can be suppressed. Not only that, since the filter of this embodiment is constructed in such a manner that the bus bars in the central part of the IDT electrodes are electrically independent, all of the IDT electrodes in SAW resonator 52 and the IDT electrodes in SAW resonator 54 can be wired independently. As a result, by configuring terminals as shown in FIG. 5, a balanced input-output of the SAW filter will be possible.

According to this embodiment, among the IDT electrodes comprising the SAW filter only the IDT electrode of SAW resonator 53a in the center is grounded, and at this part input-output terminals are electrically independent. Therefore, input-output characteristics of the filter are not directly affected by how the IDT electrodes are grounded, and furthermore, since direct components of signals between the input-output terminals decrease considerably, out-of-band rejection characteristics of the filter are improved even more. Also, a balanced type element such as an IC can be connected upstream and downstream to the filter without using an outside circuit of balun or the like. Thus, noise characteristics of the whole circuit are improved as well.

Figure 6:
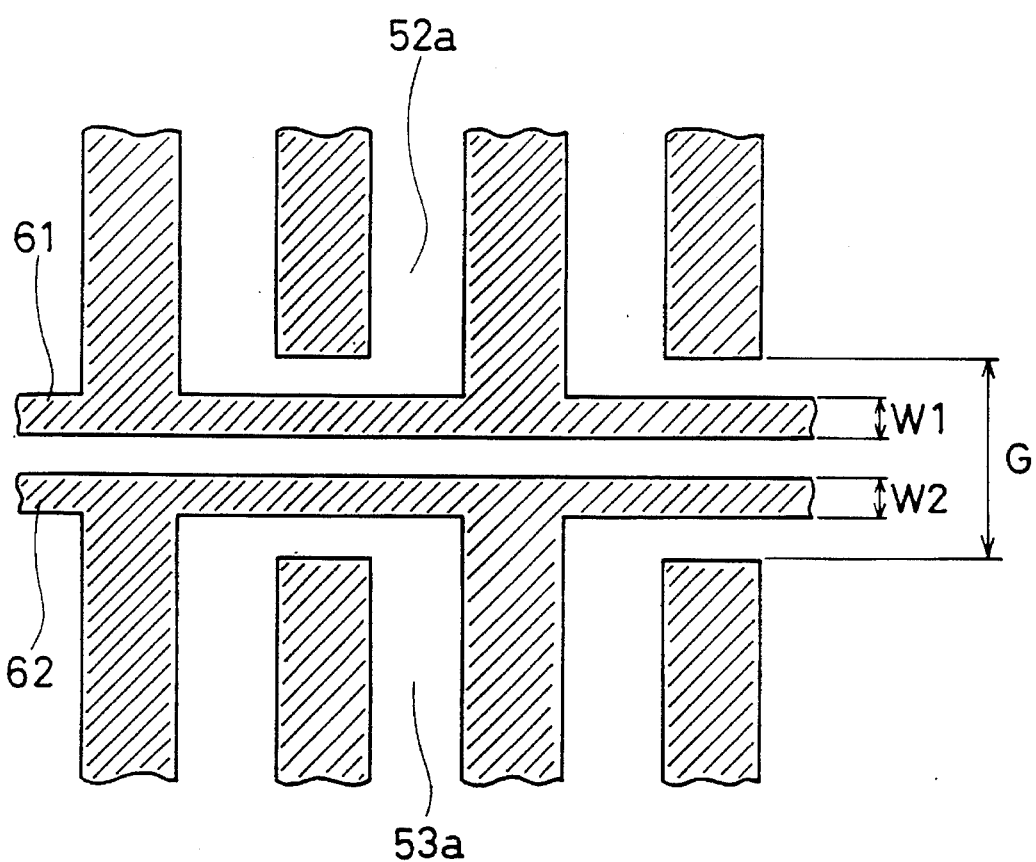
FIG. 6 is an enlarged view of a part where IDT electrodes of a surface acoustic wave filter are disposed closely to each other of a second embodiment of this invention.

FIG. 6 is an enlarged view of a part where IDT electrodes 52a and 53a are closely disposed in FIG. 5. A distance G controls the coupling degree of the two SAW resonators. The smaller this distance is, the stronger the coupling degree becomes, which is preferable for attaining a broader band. If G becomes too small, however, widths W1 and W2 of the bus bar electrodes disposed in this part become much smaller so that the electrical resistance loss of the IDT electrodes in this part affects insertion loss of the filter considerably. In this embodiment, a bus bar electrode 61 is directly connected to one of balanced input terminals, and a bus bar electrode 62 is used for grounding the IDT electrode comprising the SAW resonator in the center, so they are not electrically connected to input-output terminals. In other words, W2 does not affect the insertion loss of the filter at all. Therefore, when W2 is selected to be smaller, W1 can be selected to be larger for compensation, and then, the electrical resistance loss into the input-terminal can be reduced without changing the amount of G, thereby improving the insertion loss of the filter. Furthermore, the same effect can be attained by constructing the part of an output side or the part where IDT electrodes 54a and 53a are closely disposed to be of the same structure.

Experiments were conducted under the conditions in which a filter of 240 MHz was formed on the surface of a ST crystal substrate and a length of G was one wavelength (about 12 μm). When both W1 and W2 had lengthes of 0.25 wavelength, the insertion loss was 3.86 dB. On the other hand, when W1 was 0.4 wavelength and W2 was 0.15 wavelength, the insertion loss was 2.83 dB, which shows an improvement of 1.03 dB.

Figure 7:
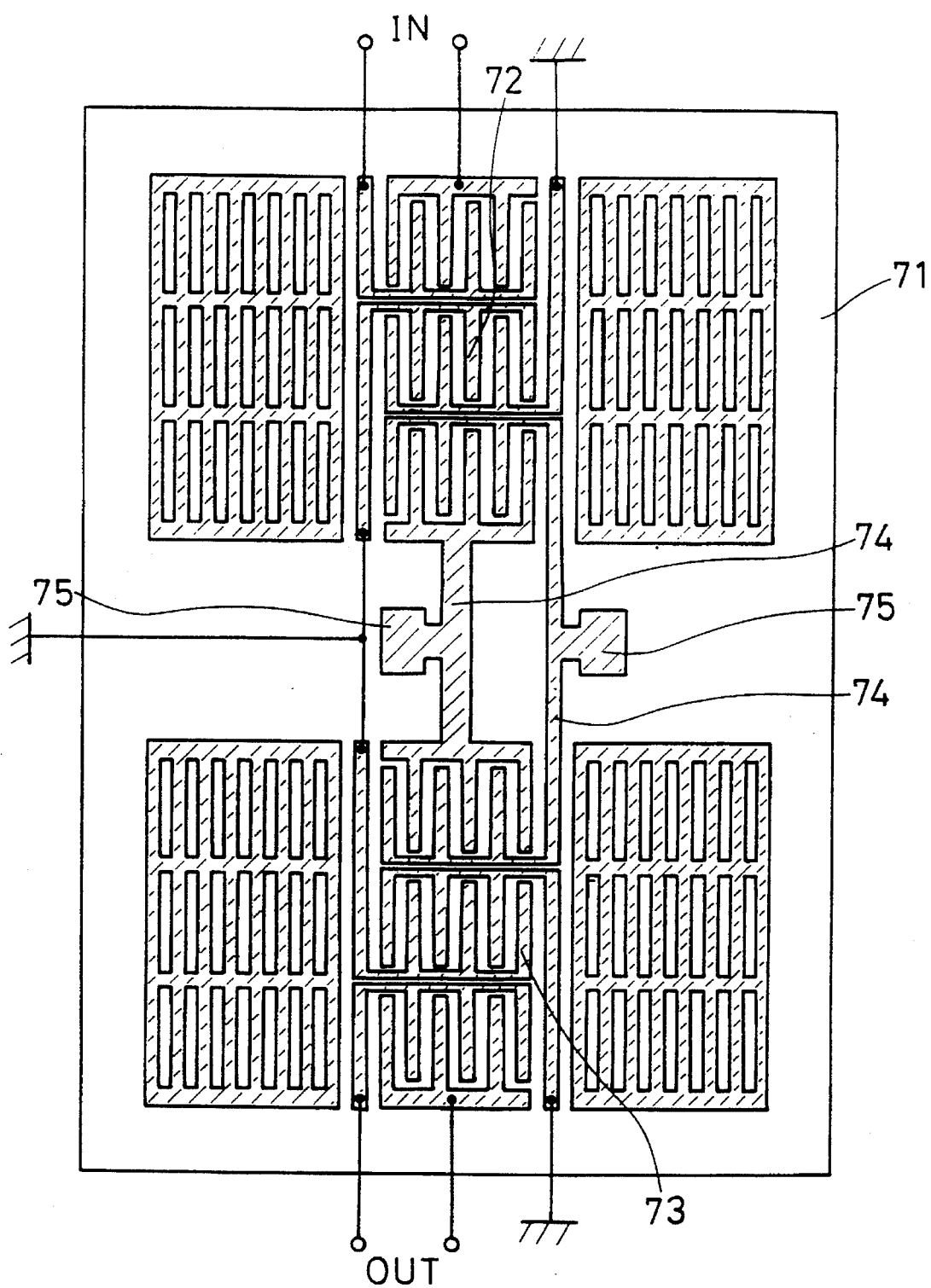
FIG. 7 is a schematic view of a multistage connected surface acoustic wave filter of a second embodiment of this invention.

As shown in FIG. 7, this embodiment can be constructed in such a manner that a plurality of SAW filters 72 and 73 are concatenately connected on the surface of the same piezoelectric substrate 71 to form a multistage connected SAW filter. In this case, although the insertion loss increases slightly, the out-of-band rejection characteristics improve considerably, so even better filter characteristics can be obtained.

If good pass characteristics are not obtained simply by connecting concatenately, a reactive element such as an inductor should be connected as a matching element to an electrode pattern 74 which serves for an interstage concatenate connection. This method can be conducted by connecting the matching element between balanced electrodes 74, but the same effect can be attained by connecting it between one of electrode patterns 74 and the earth and by grounding the other electrode of 74. Here, connection with an external circuit is simplified when an electrode pad 75 for bonding is disposed to electrode pattern 74. Or, by forming a reactive element such as a spiral inductor on the same piezoelectric substrate and by connecting one end to electrode pattern 74 while grounding the other end, an outside circuit is no longer needed so that a compact-sized filter circuit can be attained.

Accordingly, by forming the IDT electrodes of closely disposed SAW resonators to be electrically independent and by constructing it of balanced type input-output terminals, not only can the same effect as in the first embodiment be obtained but also improved characteristics can be obtained in this way.

EXAMPLE 3

Figure 8:
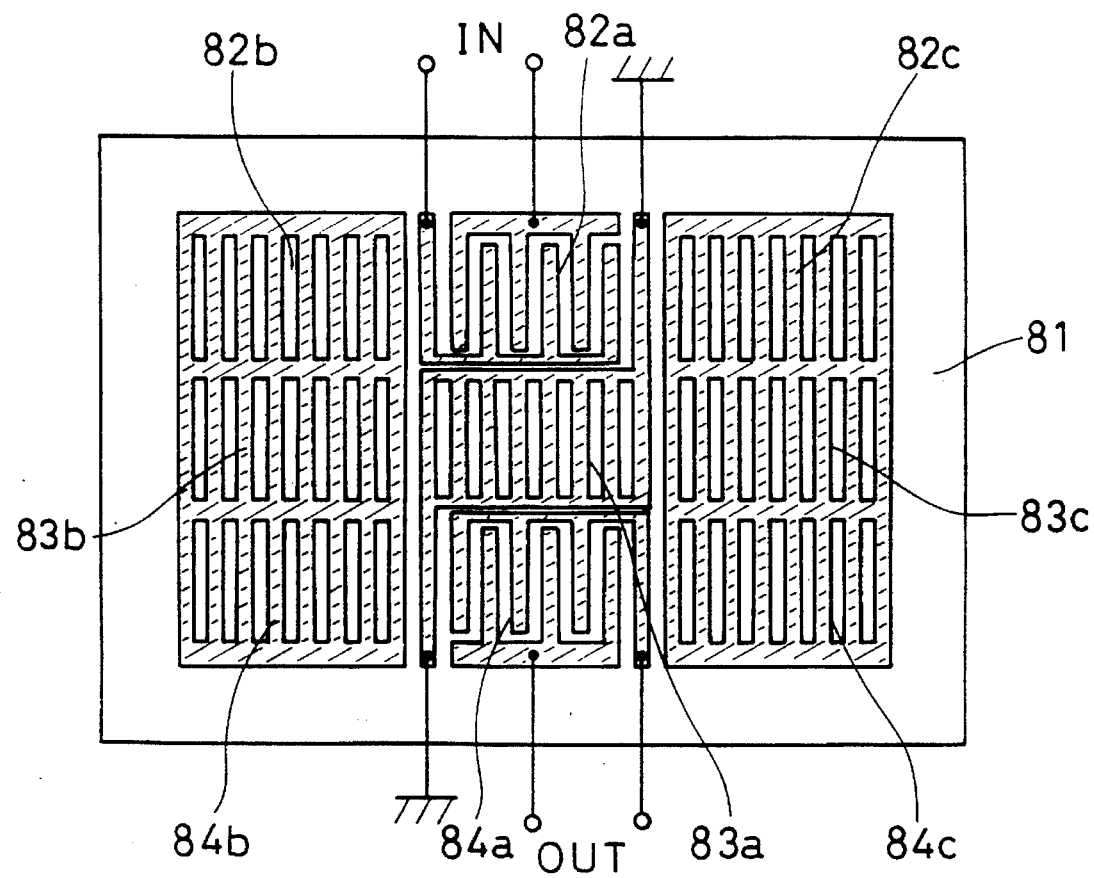
FIG. 8 is a schematic view of a surface acoustic wave filter of a third embodiment of this invention.

FIG. 8 is a schematic view of a surface acoustic wave filter of a third embodiment of this invention. FIG. 8 shows that on the surface of a monocrystal piezoelectric substrate 81, there are a first SAW resonator formed by an IDT electrode 82a and reflectors 82b, 82c and a third SAW resonator formed by an IDT electrode 84a and reflectors 84b, 84c. These elements form the same structure as of the second embodiment shown in FIG. 5. This figure differs from FIG. 5 in that an IDT electrode part of a second SAW resonator formed in the center and accompanied by reflectors 83b, 83c has the same structure with the reflectors. This figure also differs in the structure in which a periodic-structured stripline electrode row 83a has about the same length with an electrode overlap width of IDT electrode 53a in FIG. 5.

As in the second embodiment, the above-noted three SAW resonators are disposed close to each other, and the adjacent bus bar electrodes are electrically independent. Furthermore, an electrode finger of IDT electrode 82a is connected to a balanced type input terminal, while an electrode finger of IDT electrode 84a is connected to a balanced type output terminal. In addition, periodic-structured stripline electrode row 83a is grounded via an electrode pattern disposed in an aperture of IDT electrode 82a and reflector 82b and also via an electrode pattern disposed in an aperture of IDT electrode 84a and reflector 84c.

According to the surface acoustic wave filter constructed in the above manner, the surface acoustic wave can propagate in the same way as long as the electrode cycle remains the same, even if the structure of electrode 83a changes from an IDT electrode to a periodic-structured stripline electrode row in the central SAW resonator. Therefore, the operation is basically the same as that of the first embodiment shown in FIG. 2, thereby achieving a broader band and suppressing the out-of-band interference of the SAW filter. In addition, as in the second embodiment, since the bus bars in the central part of the IDT electrodes are electrically independent, a balanced input-output of the SAW filter is possible, and the out-of-band rejection characteristics of the filter can be improved.

Figure 9:
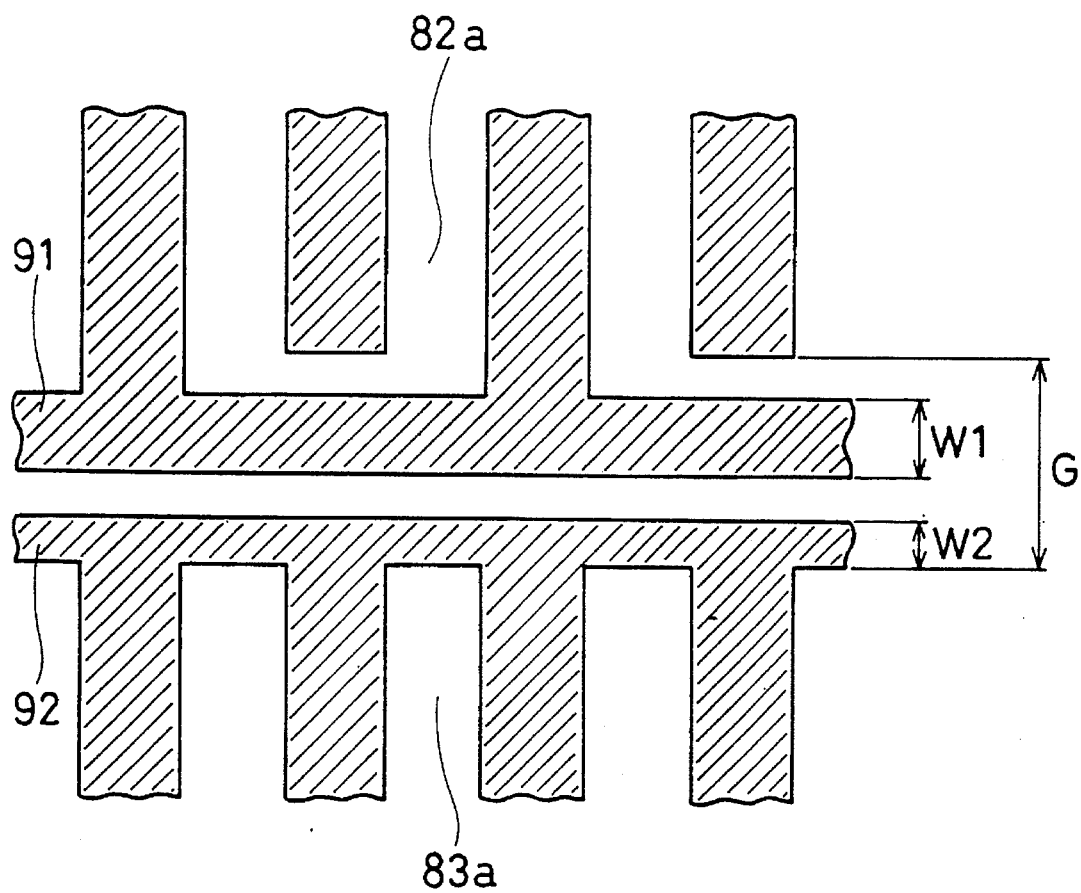
FIG. 9 is an enlarged view of a part where IDT electrodes of a surface acoustic wave filter are closely disposed to each other of a third embodiment of this invention.

Next, FIG. 9 is an enlarged view of a part where IDT electrode 82a and periodic-structured stripline electrode 83a are disposed close to each other in FIG. 8. Comparing this figure with the second embodiment in FIG. 5, a proportion of a part in distance G where the electrodes are not present reduces, and instead, the width W1 of a bus bar electrode 91 can be enlarged in comparison with the width W2 of a bus bar electrode 92. Accordingly, an insertion loss of the filter can be further improved than in the second embodiment.

According to the above-noted embodiment, not only can the same effect as in the second embodiment be obtained but also improved characteristics can be obtained in this way.

Figure 10:
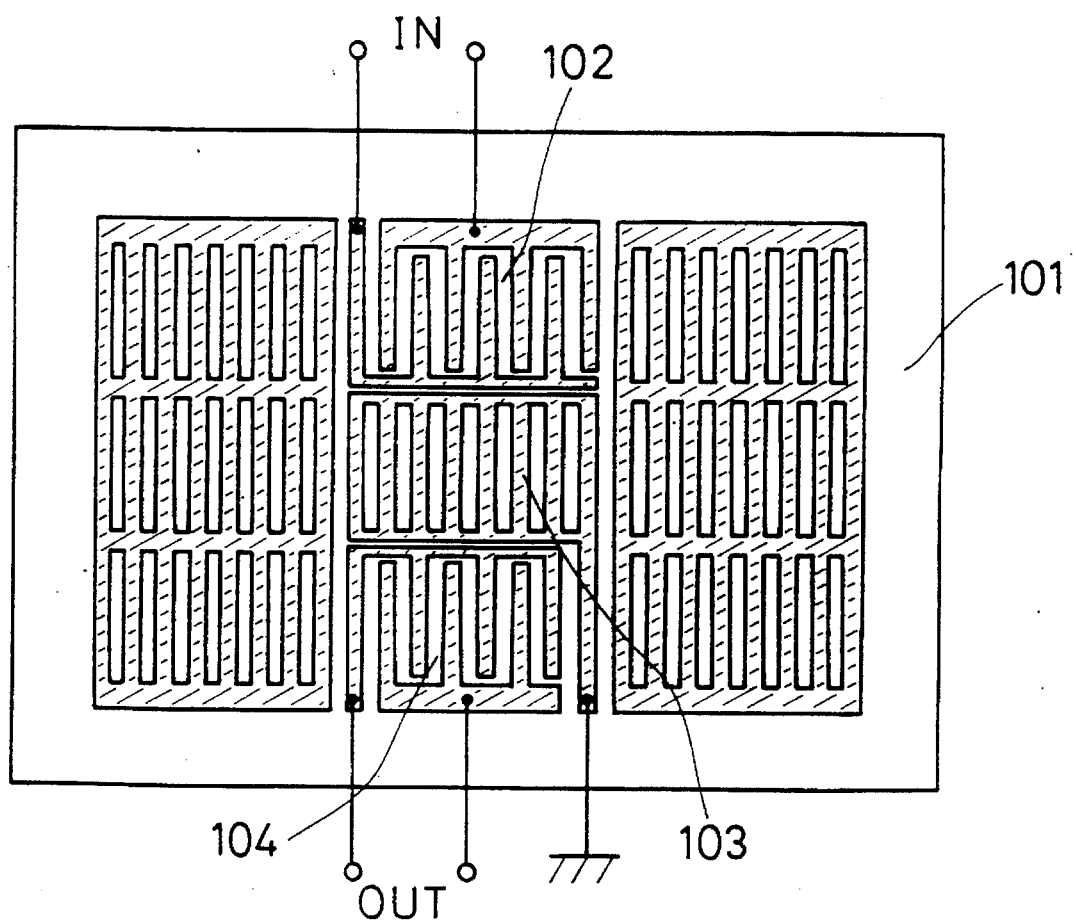
FIG. 10 is a schematic view of a part where IDT electrodes of a surface acoustic wave filter are arranged to be opposite in phase of a third embodiment of this invention.

Furthermore, IDT electrodes 82a and 84a in FIG. 8 are arranged to be equal in phase. Even if this structure is changed to be opposite in phase as with IDT electrodes 102, 104 formed on substrate 101 shown in FIG. 10, the same effect can be attained although the out-of-band interference appears slightly differently. According to FIG. 10, a periodic-structured stripline electrode row 103 is grounded only via an aperture of IDT electrode 104 side. However, this kind of slight difference in symmetry of the upper and lower electrode patterns scarcely affects the filter characteristics, and therefore, the wiring to the outside can be simplified.

Also in this embodiment, a plurality of SAW filters can be concatenately connected to form a multistage connected SAW filter. In this way, the out-of-band rejection characteristics can be improved considerably, thereby obtaining even better filter characteristics. Here, the same method of concatenate connection as in the second embodiment shown in FIG. 7 can be applied.

Figure 11:
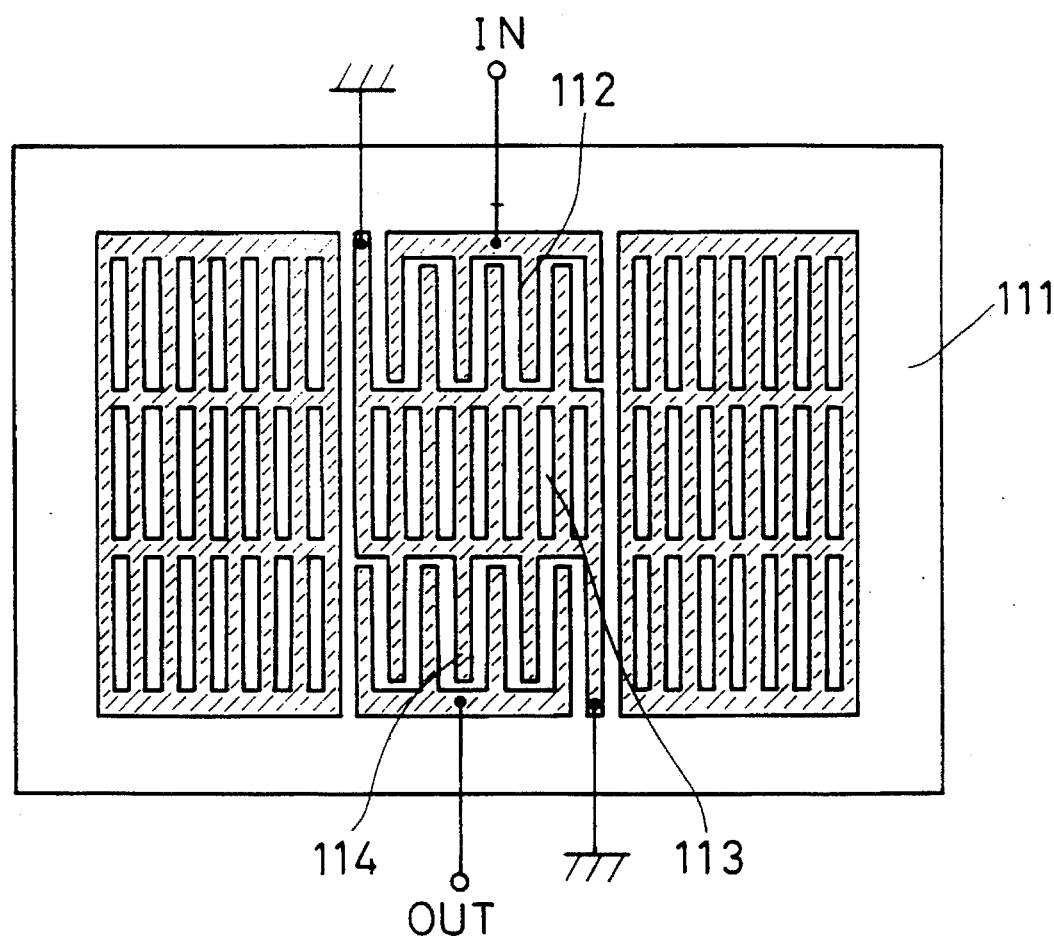
FIG. 11 is a schematic view of a surface acoustic wave filter in an unbalanced input-output condition of a third embodiment of this invention.

Additionally in this embodiment, described in comparison with the second embodiment, it was assumed that the structure of input-output electrodes of the SAW filter was balanced. However, the same effect can be attained in comparison with the first embodiment with an unbalanced input-output structure as shown in FIG. 11 where 111 is a monocrystal piezoelectric substrate, 112, 114 are IDT electrodes, 113 is a periodic-structured stripline electrode row, and common bus bars are formed at the part where the SAW resonators are disposed close to each other.

EXAMPLE 4

Figure 12:
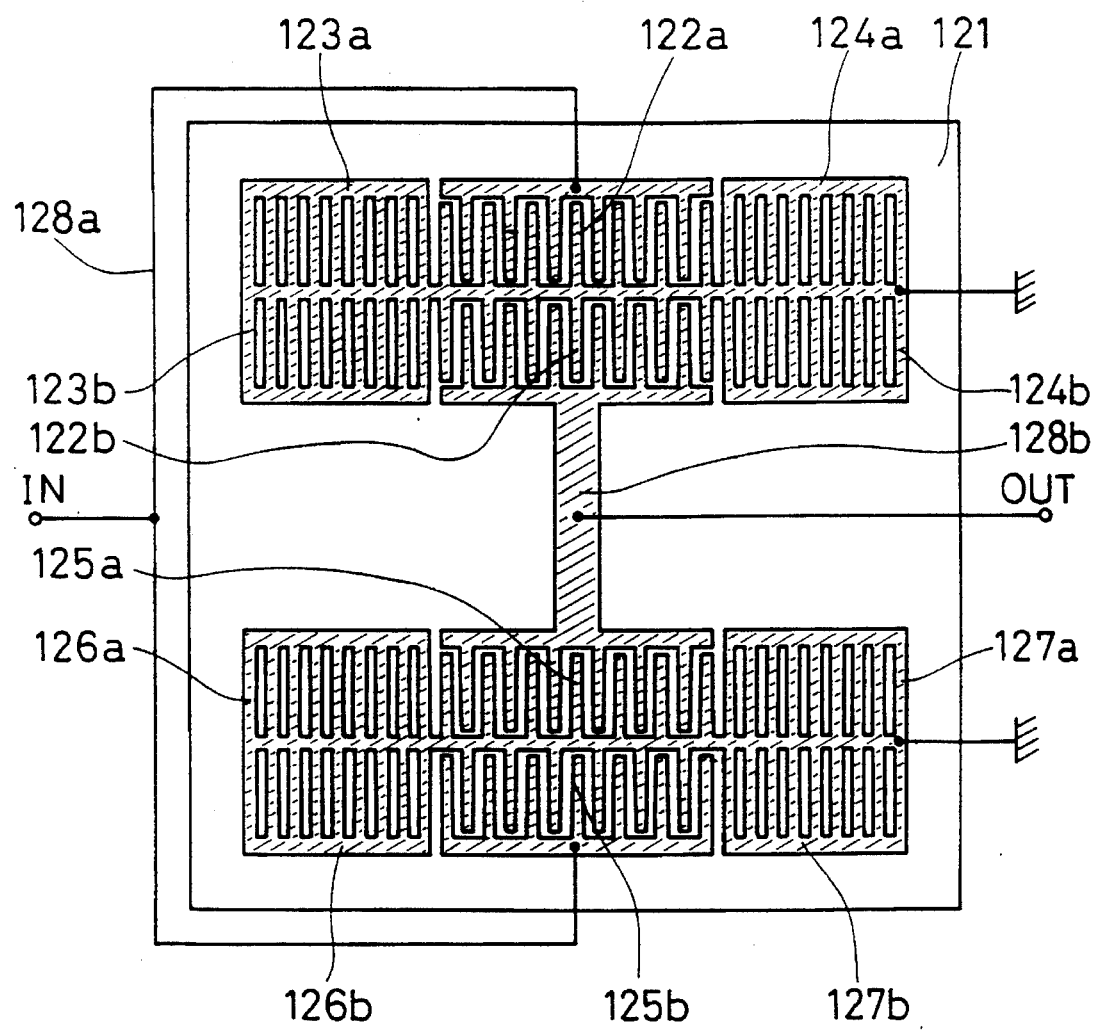
FIG. 12 is a schematic view of a surface acoustic wave filter of a fourth embodiment of this invention.

FIG. 12 is a schematic view of a surface acoustic wave filter of a fourth embodiment of this invention. In FIG. 12, a first SAW resonator is formed by IDT electrodes 122a, 122b and reflectors 123a, 124a, 123b, 124b disposed on the surface of a monocrystal piezoelectric substrate 121, and electrode fingers of IDT electrodes 122a, 122b are arranged to be opposite in the phase relationship. On the same piezoelectric substrate 121, a second SAW resonator is formed by IDT electrodes 125a, 125b and reflectors 126a, 127a, 126b, 127b, and electrode fingers of IDT electrodes 125a, 125b are arranged to be equal in the phase relationship. These two SAW filters are parallel-connected electrically by the electrode patterns or circuit patterns 128a, 128b.

Next, operation of the surface acoustic wave filter constructed above will be explained.

Figure 13:
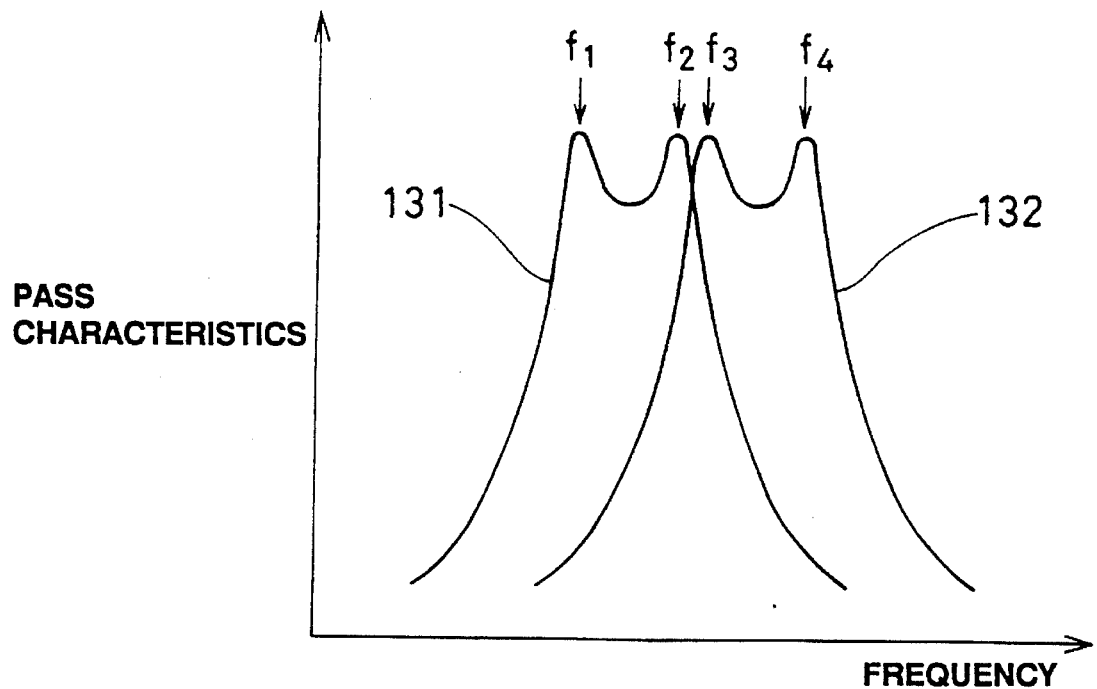
FIG. 13 (a) and (b) are graphs showing pass band characteristics during operations of a surface acoustic wave filter of a fourth embodiment of this invention.
Figure 13:
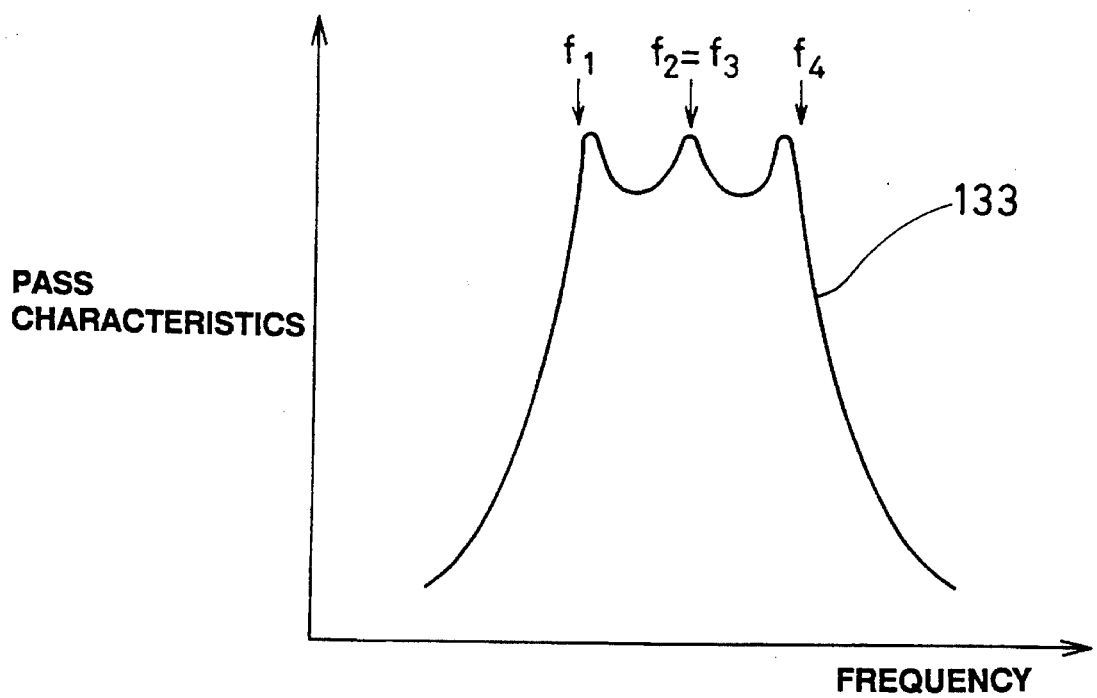

FIGS. 13 (a) and (b) show pass characteristics of a SAW filter of this embodiment at direct-coupled 50 Ω. In FIG. 13 (a), 131 and 132 are single pass characteristics of either a first or a second SAW resonator filter shown in FIG. 12. In this way, a single SAW resonator filter has two excitation frequencies of $f_1$ and $f_2$ ($f_1 < f_2$) or $f_3$ and $f_4$ ($f_3 < f_4$), and the phase relationship is opposite to each other. According to FIG. 12, the IDT electrodes in the first SAW resonator filter are arranged to be opposite in phase, while the IDT electrodes in the second SAW resonator filter are arranged to be equal in phase. Therefore, the phase relationship between $f_1$ and $f_2$ becomes opposite to that between $f_3$ and $f_4$. In other words, $f_2$ and $f_3$ become equal in phase. As a result, by conforming the excitation frequencies of $f_2$ and $f_3$, the band width can be broadened without deteriorating pass characteristics of the band, as shown in FIG. 13 (b) 133.

It is actually difficult to conform $f_2$ with $f_3$ completely, so a difference appears more or less. When $f_2$ is smaller than $f_3$, this difference merely causes the pass band characteristics to deteriorate gradually. When $f_2$ is larger than $f_3$, the phase changes greatly because of the overlapping peaks, and in particular, the group delay deviation characteristics are greatly disturbed. Thus, in view of the formation deviation etc. of the SAW filter, the yield of the filter improves by shifting the peak value on the side of $f_2 < f_3$.

Furthermore, by using an electrode pattern disposed on the surface of the piezoelectric substrate to form a part of the parallel-connected SAW filters, stray capacitance of wire or undesired radiation etc. caused by installing bonding wire around can be prevented so that good filter characteristics can be obtained in this way.

According to the embodiment described above, the SAW filters whose IDT electrode fingers are opposite in phase are parallel-connected, and one of the high side excitation frequency was conformed to the other of the low side excitation frequency. As a result, a band of the SAW multiple mode filter can be broadened without using an outside elongation coil or the like.

In this embodiment, the electrode pattern was used only on one side to conduct the parallel connection, but naturally, electrode patterns can be also used for all the connecting parts.

EXAMPLE 5

Figure 14:
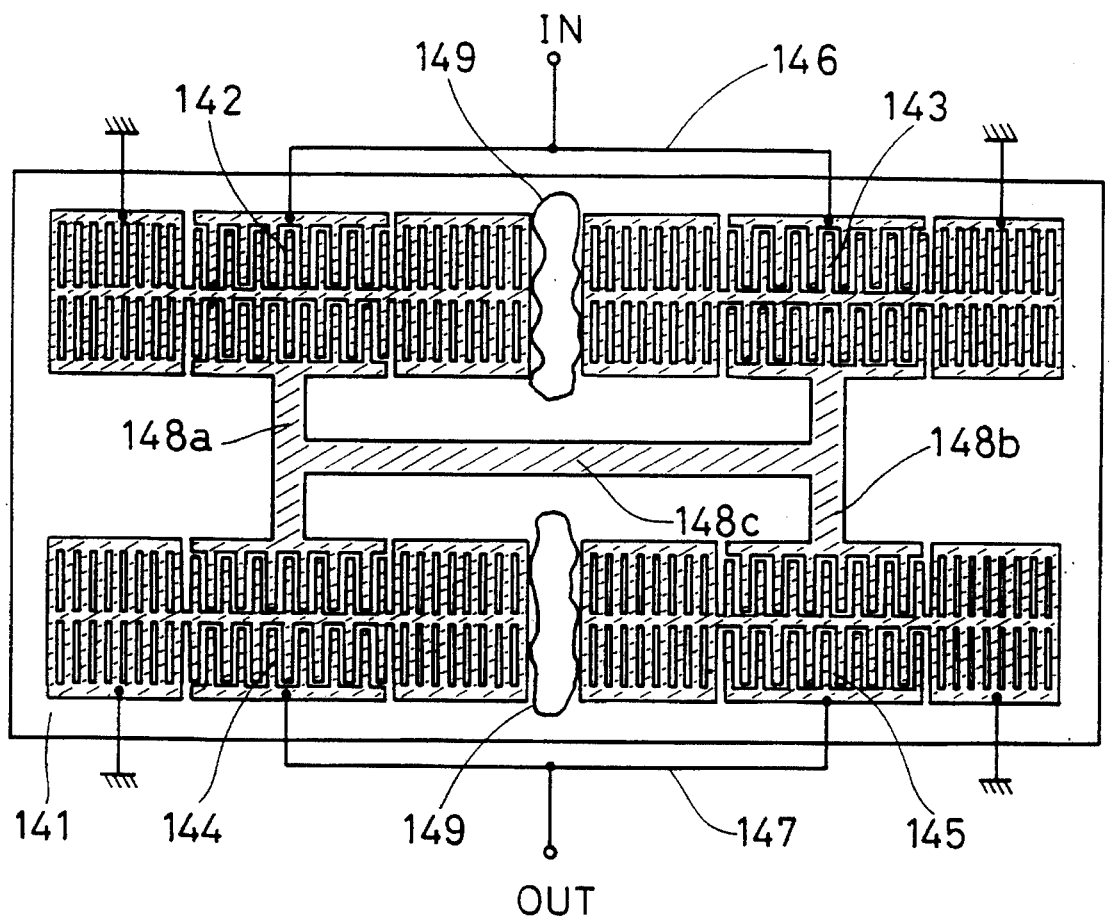
FIG. 14 is a schematic view of a surface acoustic wave filter of a fifth embodiment of this invention.

FIG. 14 is a schematic view of a surface acoustic wave filter of a fifth embodiment of this invention. In FIG. 14, SAW resonator filters 142, 143, 144, 145 are formed on the surface of a piezoelectric substrate 141. As with the first SAW resonator filter in FIG. 12, SAW resonator filters 142, 144 have adjacent electrode fingers arranged to be opposite in phase. Also as with the second SAW resonator filter in FIG. 12, SAW resonator filters 143, 145 have adjacent electrode fingers arranged to be equal in phase. Then, SAW resonator filters 142, 143 and 144, 145 are parallel-connected respectively through bonding wire 146, 147 or electrode patterns 148a, 148b, 148c. Furthermore, these two pairs of parallel-connected SAW filters are concatenately connected through electrode patterns 148a and 148b. 149 is an absorber disposed for intercepting the propagation of surface acoustic waves caused by a different SAW resonator filter.

In the surface acoustic wave filter constructed in the above-noted manner, the two pairs of parallel-connected SAW filters are respectively operated as in the first embodiment. When these filters are concatenately connected, the out-of-band rejection is improved even more.

Also in this embodiment, by using the electrode pattern disposed on the surface of the piezoelectric substrate, the SAW filters are parallel-connected and concatenately connected. As a result, stray capacitance of wire or undesired radiation etc. caused by installing bonding wire around can be prevented so that good filter characteristics can be obtained in this way.

In addition, by disposing the SAW filters having the same characteristics parallel and adjacent to the propagation direction of the surface acoustic wave, undesired stray capacitance is eliminated between the concatenately connected multistage connected SAW filters, and therefore, an interstage matching circuit is no longer needed. Accordingly, the circuit can be compact-sized, while stable characteristics of the filter can be achieved.

Also in this case, if good pass characteristics can not be obtained simply by connecting concatenately, a matching element such as an inductor should be connected to electrode patterns 148a, 148b, and 148c which conduct the interstage concatenate connection.

As described above, by connecting parallel-connected SAW filter concatenately, the same effect as in the fourth embodiment can be attained. At the same time, the characteristics can be improved even more.

In this embodiment, each stage is parallel-connected by an electrode pattern 148c. However, the same effect can be attained in a structure without the above-mentioned electrode pattern 148c by concatenately connecting each SAW filter and then parallel-connecting each multistage connected SAW filter.

EXAMPLE 6

Figure 15:
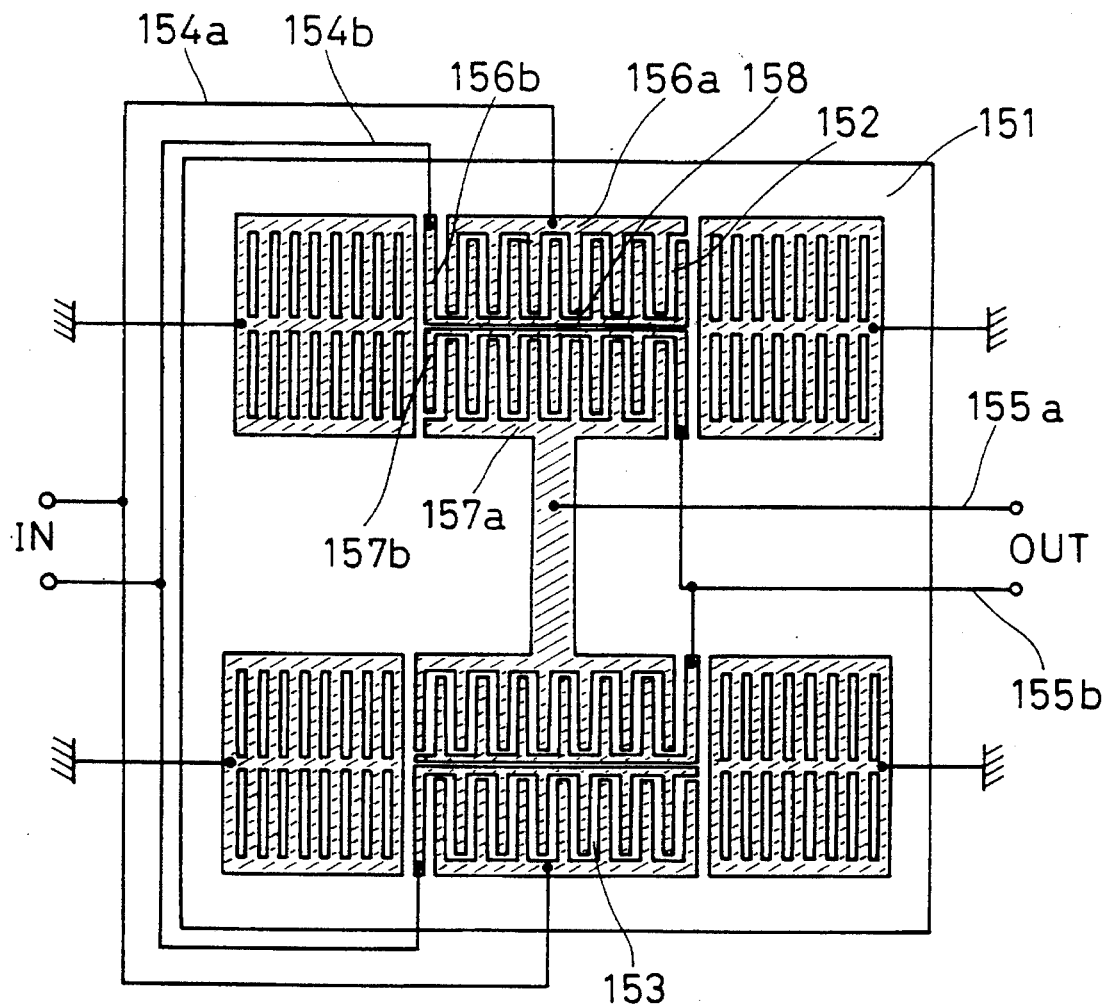
FIG. 15 is a schematic view of a surface acoustic wave filter of a sixth embodiment of this invention.

FIG. 15 is a schematic view of a surface acoustic wave filter of a sixth embodiment of this invention. In FIG. 15, SAW resonator filters 152, 153 are formed on the surface of a monocrystal piezoelectric substrate 151. 152 have the adjacent IDT electrode fingers arranged to be opposite in phase, while 153 have the adjacent IDT fingers arranged to be equal in phase. These two SAW resonator filters are electrically parallel-connected through electrode patterns 155a, 155b and through wiring patterns 154a, 154b. This configuration is the same with that of the fourth embodiment shown in FIG. 12.

This embodiment differs from FIG. 12 in that a bus bar electrode 158 in the central part of the adjacent IDT electrode fingers in SAW resonator filter 152 are divided to form electrically independent electrodes 156b, 157b respectively. Also, SAW resonator filter 153 is constructed in such a manner that the bus bar electrodes in the central part are divided.

Figure 16:
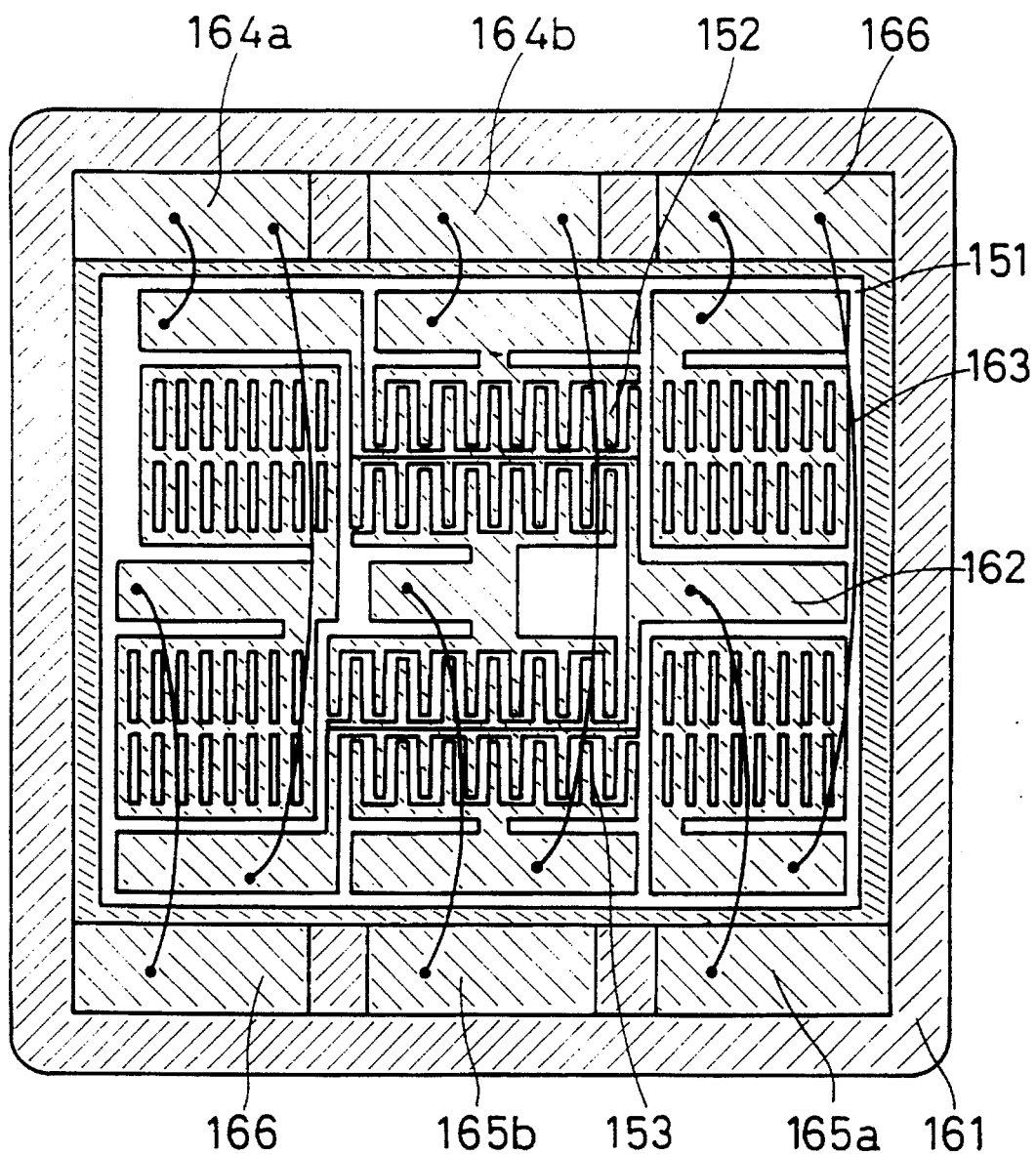
FIG. 16 is a view of a surface acoustic wave filter mounted to a face mounting package of a sixth embodiment of this invention.

FIG. 16 shows an example of the SAW filter of this embodiment which is mounted to a surface mounting package, and the same numerals are given to the parts corresponding to FIG. 15. 161 is a surface mounting package where piezoelectric substrate 151 of the SAW filter is mounted. Then, 162 is an electrode pattern for a bonding pad each connected by bonding wire 163 to input terminal electrodes 164a, 164b, output terminal electrodes 165a, 165b, or to a grounded electrode 166 etc.

The surface acoustic wave filter constructed in such a manner is operated basically in the same way as in the fourth embodiment shown in FIG. 13. Here, a band of the SAW filter can be broadened. In addition, by dividing the bus bars in the central part of the IDT electrodes, ground electrodes of an input IDT electrode part 154a, 154b and an output IDT electrode part 155a, 155b can be obtained independently. As a result, the SAW filter can conduct balanced input-output by providing wiring shown as 154a, 154b, 155a, 155b.

According to this embodiment, the IDT electrodes of the SAW filter are no longer needed to be grounded. Thus, as in the second embodiment, the input-output characteristics of the filter are not directly affected by how the SAW electrodes are grounded. Furthermore, since direct components of signals between the input-output terminals decrease considerably, the out-of-band rejection characteristics of the filter can be improved. Also, a balanced type element such as an IC can be connected to before and behind stages of the filter without using an outside circuit of balun etc. As a result, noise characteristics of the whole circuit are improved as well.

As shown in FIG. 16, by disposing the bonding pad on the surface of the piezoelectric substrate and by connecting the terminal electrodes of the surface mounting package to the bonding wire, a SAW filter that is compatible with the surface mounting package can be attained.

Figure 24:
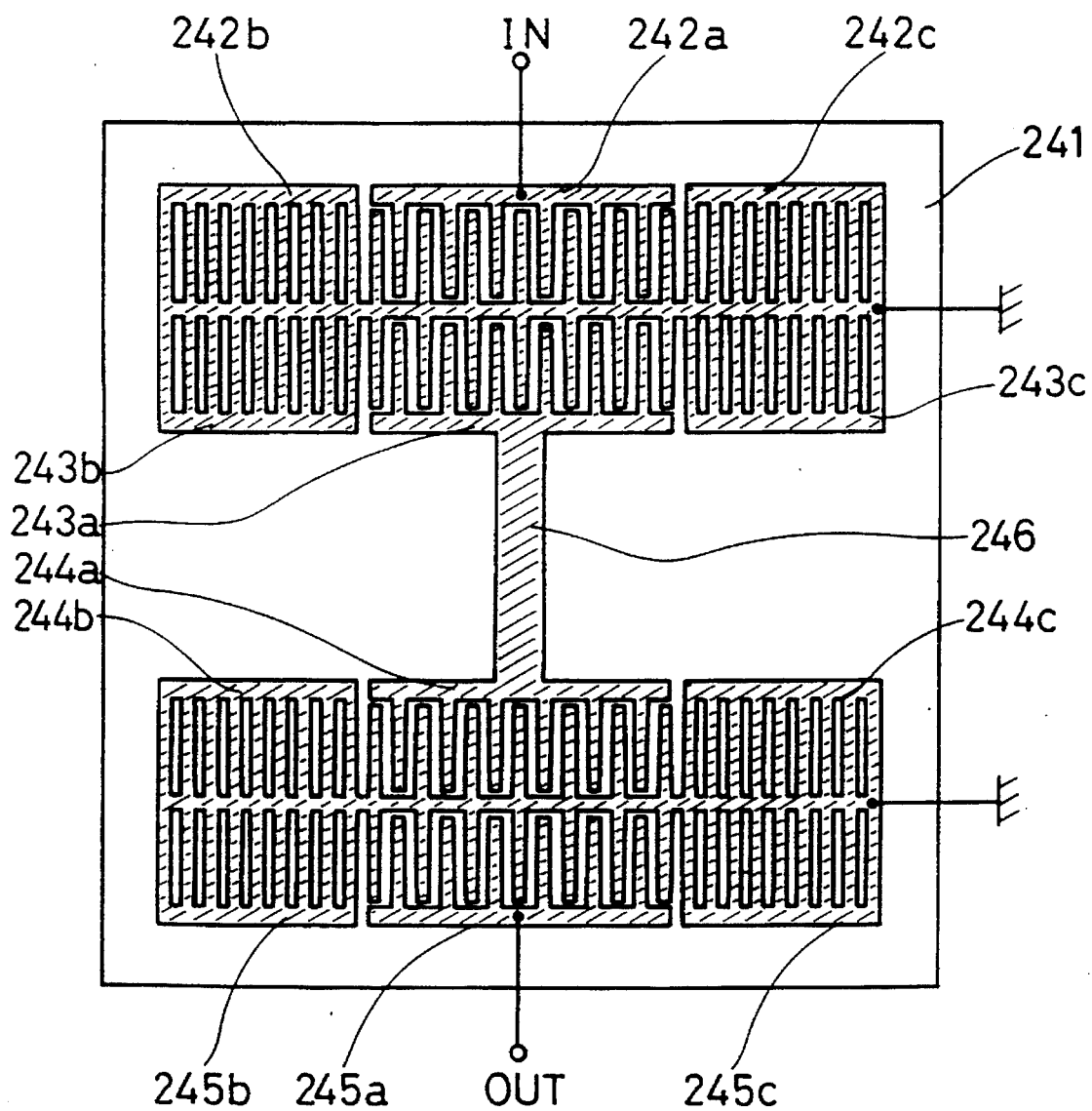
FIG. 24 is a schematic view of a conventional surface acoustic wave filter.

In addition, this structure of dividing the bus bars in the central part of the SAW filter can be applied not only to the parallel-connected type SAW filter shown in this embodiment, but also to the conventional SAW filter shown in FIG. 24.

Also in this embodiment, the SAW filter was described assuming that there is one stage. Naturally, this method can be applied to the multistage SAW filter with two or more stages shown in the fifth embodiment of this invention.

EXAMPLE 7

Figure 17:
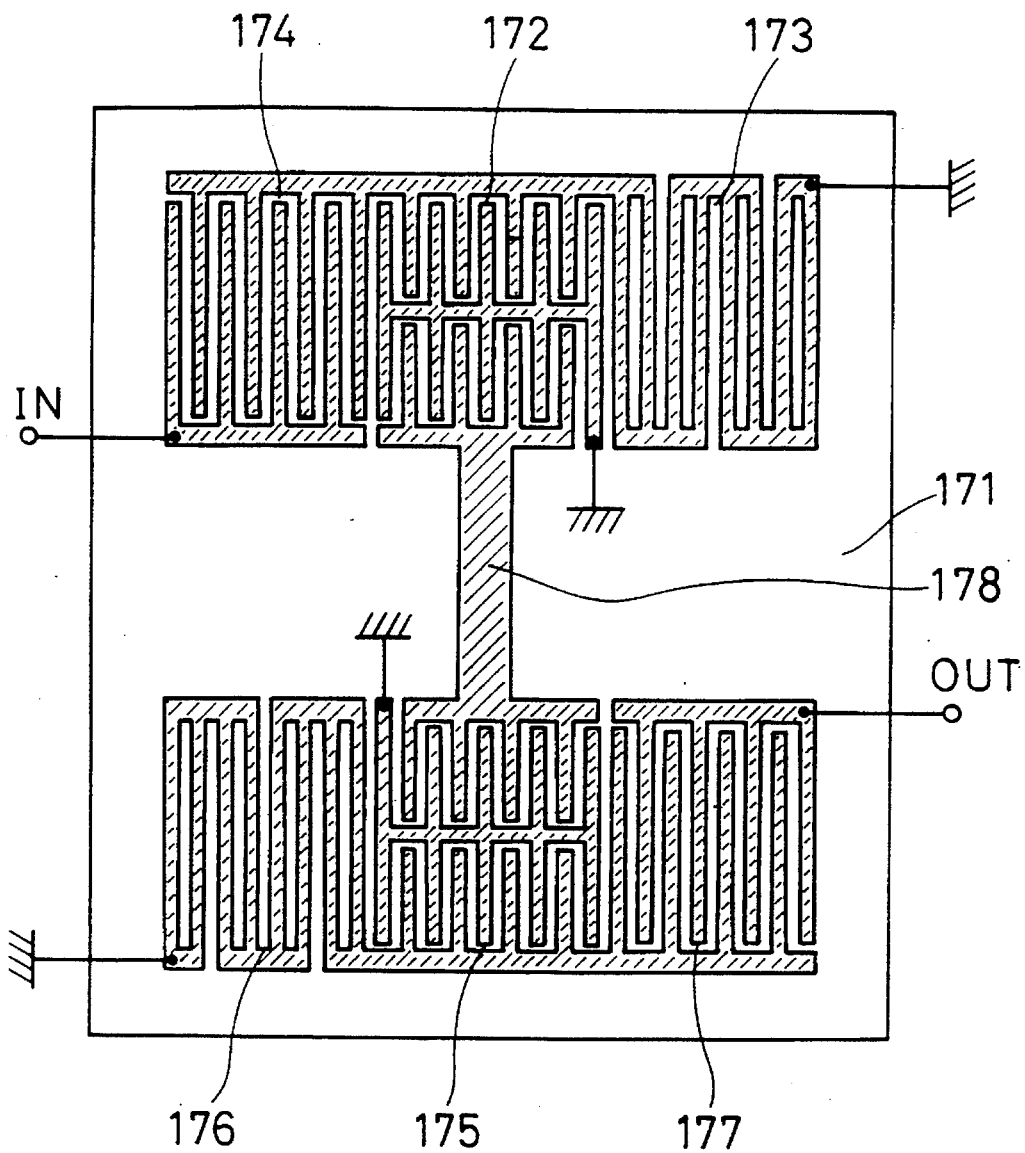
FIG. 17 is a schematic view of a surface acoustic wave filter of a seventh embodiment of this invention.

FIG. 17 is a schematic view of a surface acoustic wave filter of a seventh embodiment of this invention. In FIG. 17, a first-stage SAW resonator filter comprising an IDT electrode 172 and reflector electrodes 173, 174 is formed on the surface of a piezoelectric substrate 171. On the surface of piezoelectric substrate 171, there is also a second-stage SAW resonator filter comprising an IDT electrode 175 and reflector electrodes 176, 177. The above-mentioned two stages of SAW resonator filters are concatenately connected electrically through an interstage electrode pattern 178, thereby forming a multistage connected SAW filter. Here, the first- and second-stage SAW resonator filters have two energy trapping type SAW resonators disposed close to each other to form an acoustic coupling.

Reflector electrodes 173 and 176 form meander line inductor electrodes which are each formed by bundling a plurality of stripline electrodes and then connecting them in a zigzag pattern. The reflector electrodes are respectively parallel-connected between the electrodes on the input-output side of IDT electrodes 172, 175 and the earth. Furthermore, reflector electrodes 174, 177 form inter-digital capacitor electrodes which are respectively serially connected to the electrodes on the input-output side of IDT electrodes 172, 175.

Next, the operation of the surface acoustic wave filter constructed above will be explained.

Figure 18:
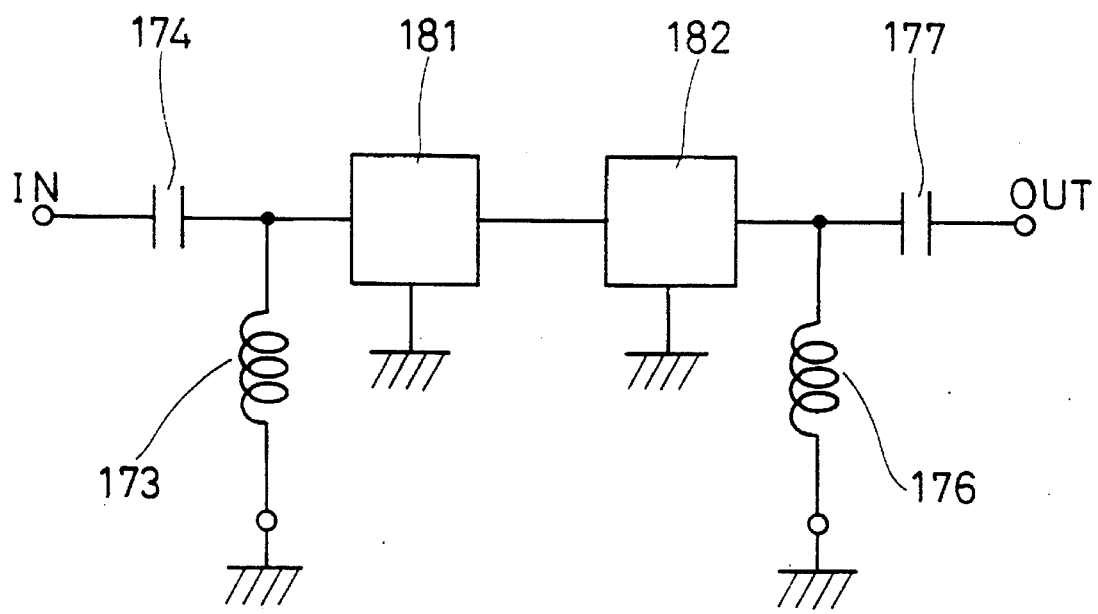
FIG. 18 is an equivalent circuit view of a surface acoustic wave filter of a seventh embodiment of this invention.

FIG. 18 is an equivalent circuit view of a SAW filter electrode pattern in a seventh embodiment of this invention. The same numerals are given to the parts corresponding to that in FIG. 17. Here, 181 is a first-stage SAW filter, and 182 is a second-stage SAW filter.

In FIG. 17, electrode patterns 173, 174, and 176, 177 are formed as acoustic reflectors of the SAW resonators comprising the SAW multiple mode filter. When each electrode is seen as a transmission line, 173, 176 function as meander line inductors and 174, 177 as inter-digital capacitors. Therefore, these reflector electrodes are connected to the input-output side electrodes of IDT electrodes 172, 175 as described above to form a matching circuit shown in FIG. 18.

Accordingly, a reactive electrode pattern disposed on the surface of piezoelectric substrate 171 functions as the matching circuit of the SAW filter. As a result, an exterior matching circuit is no longer needed so that a number of components can be reduced, thereby miniatuarizing the whole circuit. Furthermore, since the above-noted reactive electrode pattern is formed by using the reflector electrodes of the SAW resonator, the circuit structure above can be attained with about the same piezoelectric substrate area as with a conventional filter.

Furthermore, when the reactive elements are formed by the stripline electrodes of the reflectors, differences in the element amount can be reduced in comparison with the case using exterior circuit elements, so the circuit characteristics of the SAW filter can be even more stablized. Also, when the meander lines are constructed such that they comprise several reflector stripline electrodes per one direction (two lines each in 173, 176 of FIG. 17), the resistance component of the inductor can be reduced to prevent the filter characteristics from deteriorating. The number of reflectors per one line should be selected suitably according to the necessary inductance value and resistance value.

As described above, this embodiment can attain a SAW filter in which the filter matching circuits are combined together on the surface of the piezoelectric substrate.

In this embodiment, the matching circuits were described as an example in which the inductors were parallel-connected and the capacitors were serially connected. However, the structure is not limited to this type, and the circuit structure can be changed flexibly according to the impedance of the SAW filter.

EXAMPLE 8

Figure 19:
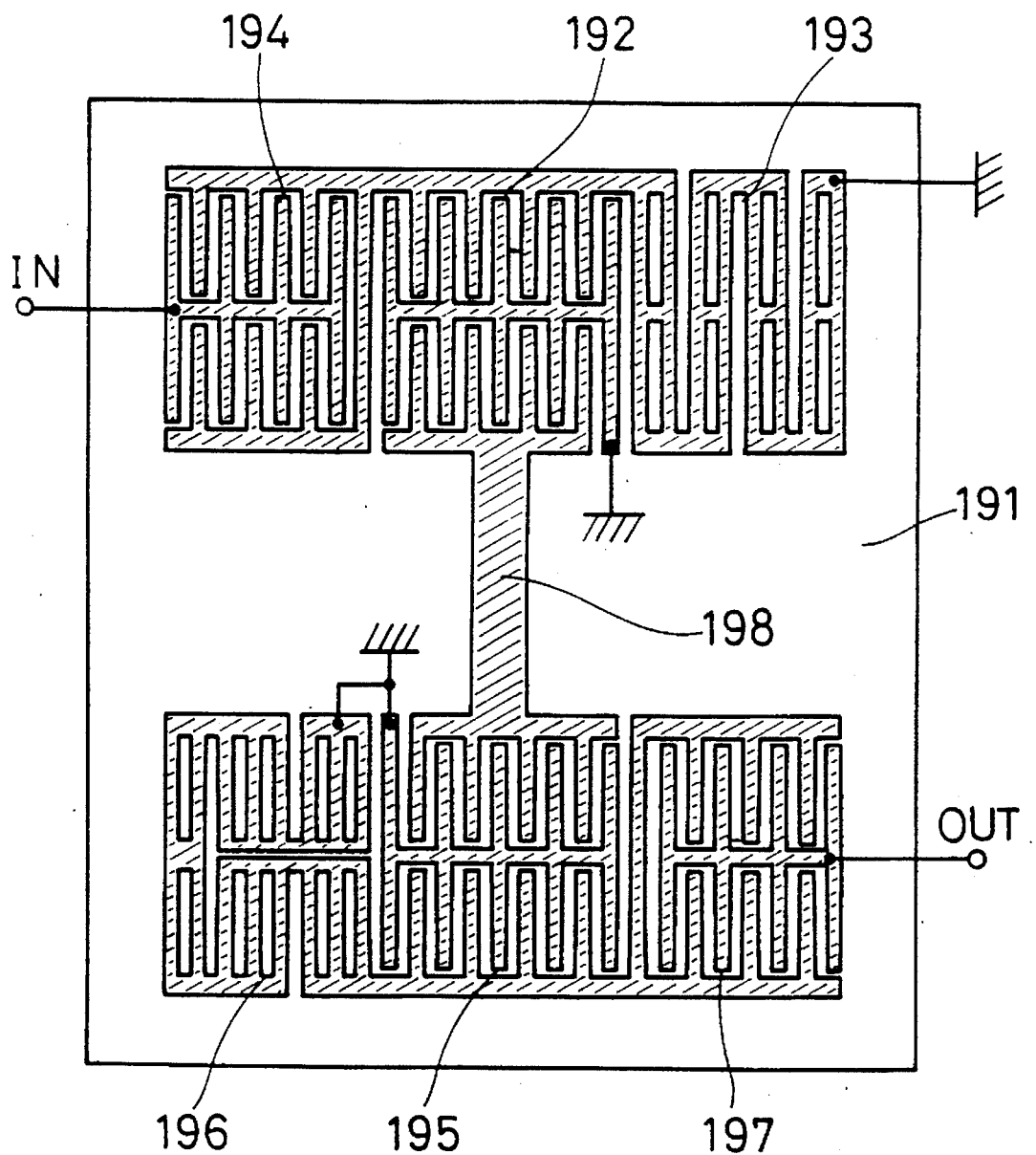
FIG. 19 is a schematic view of a surface acoustic wave filter of an eighth embodiment of this invention.

FIG. 19 is a schematic view of a surface acoustic wave filter of a eighth embodiment of this invention. In FIG. 19, a first-stage SAW resonator filter comprising an IDT electrode 192 and reflector electrodes 193, 194 is formed on the surface of a piezoelectric substrate 191. A second-stage SAW resonator filter comprising an IDT electrode 195 and reflector electrodes 196, 197 is formed on piezoelectric substrate 191. The above-mentioned two stages of SAW resonator filters are concatenately connected electrically through an interstage electrode pattern 198 to form a multistage connected SAW filter. Here, the first- and the second-stage SAW resonator filters are constructed such that the two energy trapping type SAW resonators are disposed close to each other to form an acoustic coupling.

Reflector electrodes 193 and 196 form meander line inductor electrodes which are each formed by bundling a plurality of stripline electrodes and then connecting them in a zigzag pattern. Then, a short-circuit electrode is formed in the center of the stripline electrode of reflector electrode 193, and in reflector electrode 196, the meander line is folded back in the center of the stripline electrode. Furthermore, reflector electrodes 194, 197 comprise inter-digital capacitor electrodes. The input-output terminals are taken out from the common bus bar parts in the center of reflector electrodes 194, 197 which are each formed such that the electrode inconsecutive parts in the central part of the reflectors are excluded as much as possible.

In the SAW filter constructed above, as in the seventh embodiment, the matching circuits at the input-output stages are formed on the surface of the same piezoelectric substrate 191, and at the same time, the common bus bar electrodes of the reflector parts are present. As a result, undesired coupling between the closely disposed SAW resonators is suppressed, thereby obtaining even better filter characteristics.

Besides in this embodiment, the circuit structure can be changed flexibly according to impedance of the SAW filter.

EXAMPLE 9

Figure 20:
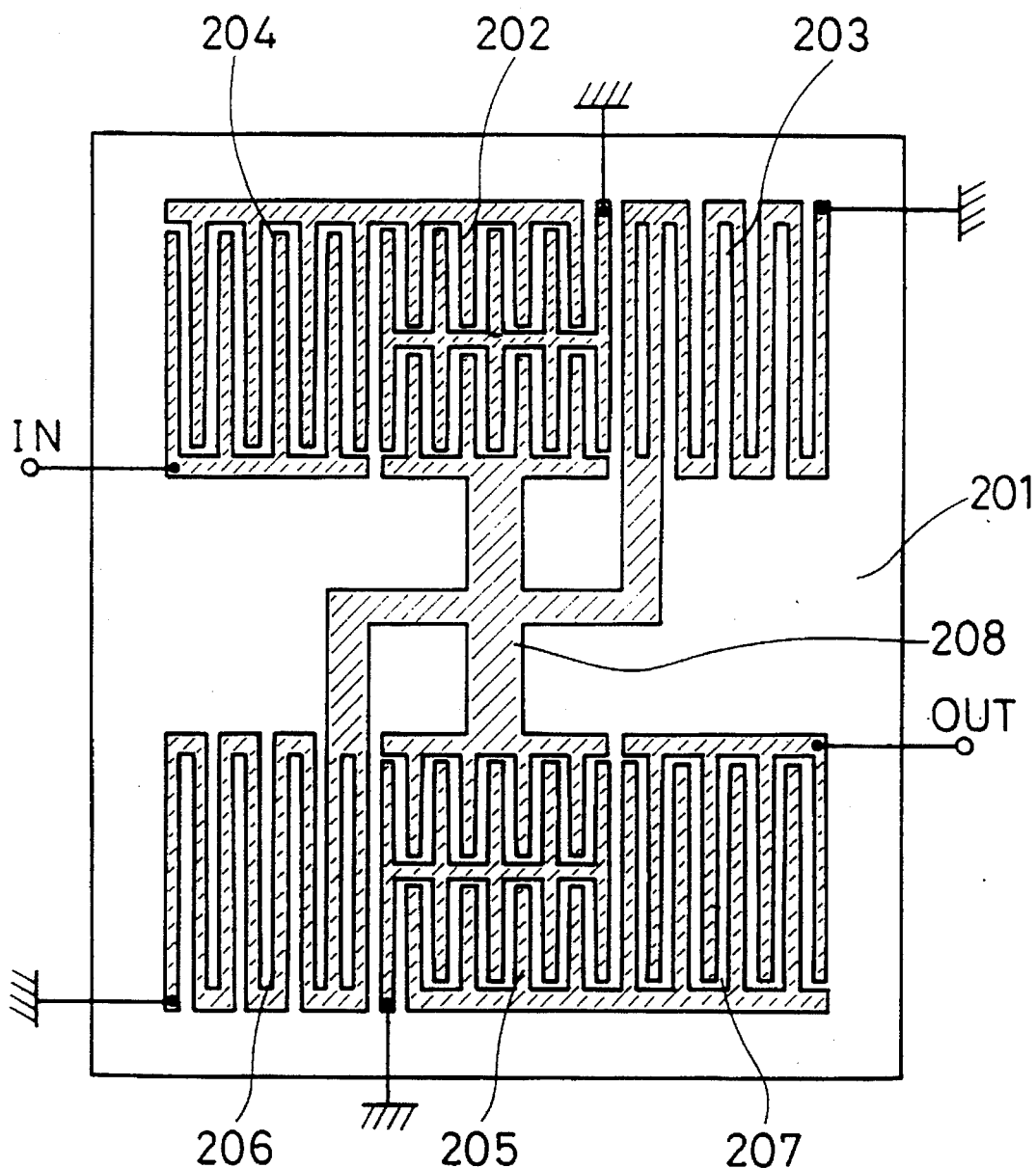
FIG. 20 is a schematic view of a surface acoustic wave filter of a ninth embodiment of this invention.

FIG. 20 is a schematic view of a surface acoustic wave filter of a ninth embodiment of this invention. In FIG. 20, a first-stage SAW resonator filter comprising an IDT electrode 202 and reflector electrodes 203, 204 is formed on the surface of a piezoelectric substrate 201. Also, a second-stage SAW resonator filter comprising an IDT electrode 205 and reflector electrodes 206, 207 is formed on the surface of piezoelectric substrate 201. The above-mentioned two stages of SAW resonator filters are concatenately connected electrically through an interstage electrode pattern 208 to form a multistage connected SAW filter. Here, the first- and the second-stage SAW resonator filters are constructed such that the two energy trapping type SAW resonators are disposed close to each other to form an acoustic coupling.

Reflector electrodes 203, 206 form meander line inductor electrodes which are formed by connecting stripline electrodes in a zigzag pattern which are parallel-connected respectively between an interstage electrode pattern 208 of IDT electrodes 202, 205 and the earth. Furthermore, reflector electrodes 204, 207 comprise inter-digital capacitor electrodes which are serially connected respectively to the input-output side electrodes of IDT electrodes 202, 205.

Next, the operation of the surface acoustic wave filter constructed above will be explained.

Figure 21:
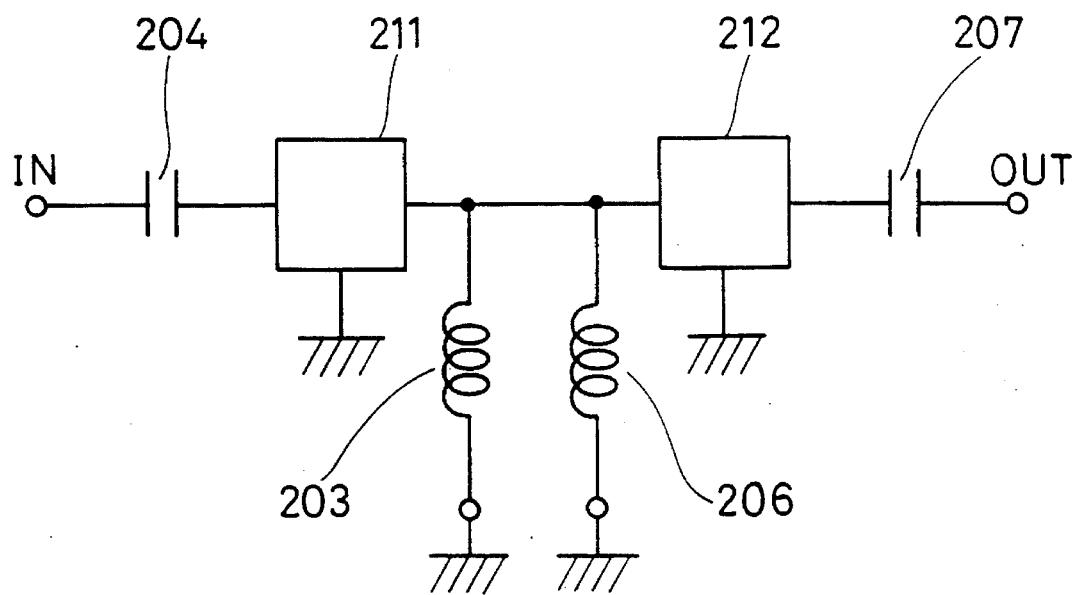
FIG. 21 is an equivalent circuit view of a surface acoustic wave filter of a tenth embodiment of this invention.

FIG. 21 is an equivalent circuit view of a surface acoustic wave filter electrode pattern in a ninth embodiment of this invention. The same numerals are given to the parts corresponding to FIG. 20. Here, 211 shows a first-stage SAW resonator filter, and 212 is a second-stage SAW resonator filter. As shown in FIG. 12, it is clear that reflector electrodes 204 and 207 function as a part of input-output matching circuits as in the seventh embodiment, however, reflector electrodes 203 and 206 function as matching elements for the filter interstage.

By connecting inductor elements comprising reflector electrodes at the filter interstage, an interstage unadjustment of a SAW filter can be achieved without newly increasing an electrode area on the surface of the piezoelectric substrate. It is no longer necessary to connect an adjustment circuit such as an elongation coil at the interstage of, e.g., a broadband type transversely coupled resonator type SAW filter.

Furthermore, the inductor elements of reflector electrodes 203 and 206 are parallel-connected respectively to the interstage electrode patterns so that an inductance value can be adjusted by cutting off one of the electrode patterns.

According to the above-mentioned embodiment, a SAW filter can be obtained in which the interstage adjustment circuits of the filter are also integrated on the surface of the piezoelectric substrate.

In this embodiment, the inductors were parallel-connected at the filter interstage, and the matching circuits were arranged such that the capacitors were serially connected at the input-output stages. However, the structure is not limited to this type, and the circuit structure can be changed optionally according to impedance of the SAW filter. In addition, if matching circuit elements comprising the reflector electrodes are lacking, a reactive electrode pattern can be newly formed on the surface of the piezoelectric substrate, or it can be connected to an outside circuit.

Furthermore, the reflector electrode patterns in this embodiment can be replaced with the reflector electrode patterns having common bus bars shown in the eighth embodiment.

EXAMPLE 10

Figure 22:
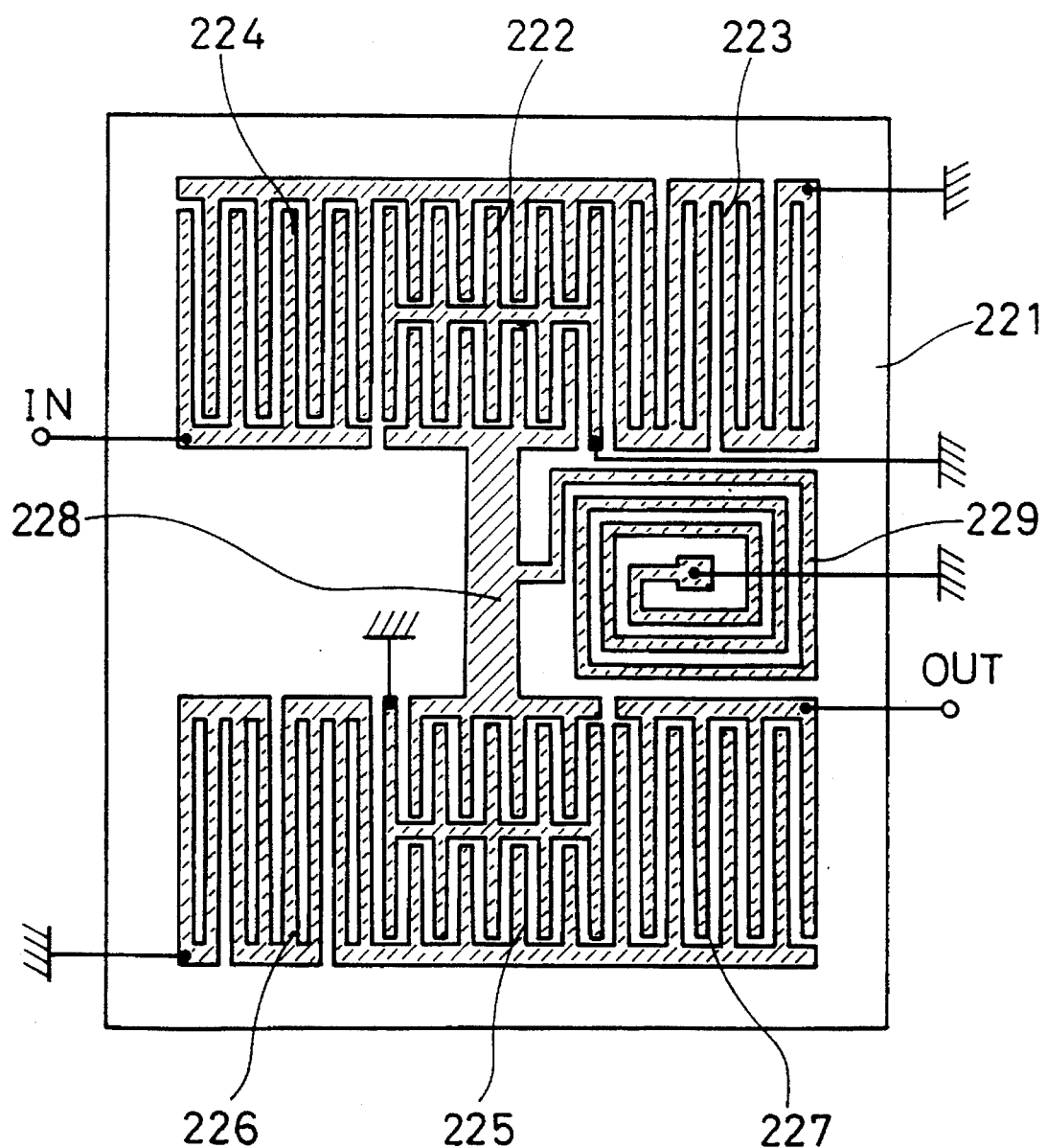
FIG. 22 is a schematic view of a surface acoustic wave filter of a tenth embodiment of this invention.

FIG. 22 is a schematic view of a surface acoustic wave filter of a tenth embodiment of this invention. In FIG. 22, a first-stage SAW resonator filter comprising an IDT electrode 222 and reflector electrodes 223, 224 is formed on the surface of a piezoelectric substrate 221. A second-stage SAW resonator filter comprising an IDT electrode 225 and reflector electrodes 226, 227 is also formed on the surface of piezoelectric substrate 221. The above-mentioned two stages of SAW resonator filters are concatenately connected electrically through an interstage electrode pattern 228 to form a multistage connected SAW filter. Here, the first- and the second-stage SAW resonator filters have two energy trapping type SAW resonators disposed close to each other which form an acoustic coupling.

Reflector electrodes 223, 226 form meander line inductor electrodes which are formed by bundling and connecting a plurality of stripline electrodes in a zigzag. They are parallel-connected respectively between input-output electrodes of IDT electrodes 222, 225 and the earth. Furthermore, reflector electrodes 224, 227 comprise inter-digital capacitor electrodes which are serially connected respectively to the input-output electrodes of IDT electrodes 222, 225. Then, the above-mentioned interstage electrode pattern 228 is grounded on piezoelectric substrate 221 via a newly formed spiral inductor electrode pattern 229.

According to the thus formed surface acoustic wave filter, circuits of a serial capacitor and a parallel capacitor are formed at input-output stages, as in the equivalent circuit shown in FIG. 18. Furthermore, the circuit comprises a parallel inductor at the interstage of the SAW filter. Therefore, as in the seventh embodiment, matching circuits at the input-output stages can be formed on the surface of the same piezoelectric substrate 221, and at the same time, an interstage adjustment circuit described in the ninth embodiment can be formed on the surface of the same piezoelectric substrate.

In addition, the first-stage SAW resonator filter and the second-stage SAW resonator filter must be formed apart from each other to some degree to prevent them from forming undesired acoustic coupling. Thus, as shown in FIG. 22, the above-noted spiral inductor electrode pattern 229 can be formed by using an space between the SAW resonator filters, so it is unnecessary to enlarge the piezoelectric substrate more than in a conventional filter. The circuit can be miniatuarized in this way.

According to the embodiment mentioned above, the same effect as in the seventh embodiment can be attained. Also, this embodiment is suitable where an interstage adjustment circuit is needed for the filter as shown in FIG. 9.

In this embodiment, the matching circuit was explained such that the inductor was parallel-connected between the filter stages, and that the inductors were parallel-connected at the input-output stages, while the capacitors were serially connected. However, the structure is not limited to this type, and the circuit structure can be changed optionally according to the impedance of the SAW filter. In addition, it is also possible to form only a part of this reactive element for use thereof.

Furthermore, the reflector electrode patterns in this embodiment can be replaced with the reflector electrode patterns having common bus bar in the eighth embodiment.

Figure 23:
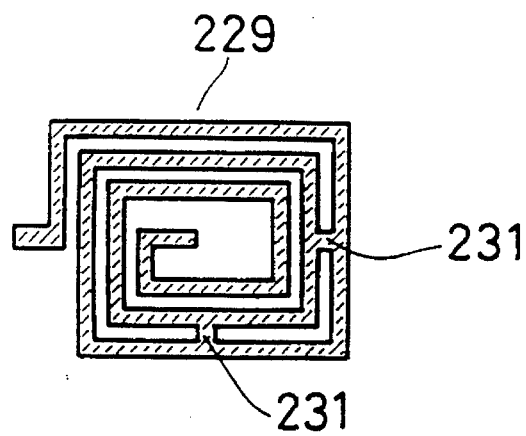
FIG. 23 (a)–(c) are schematic views of reactive electrode patterns of a seventh, eighth, ninth, and tenth embodiment of this invention.
Figure 23:
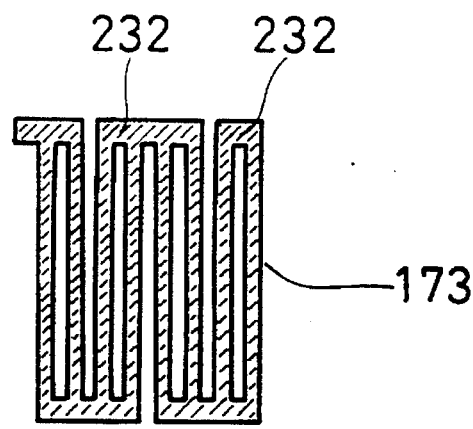
Figure 23:
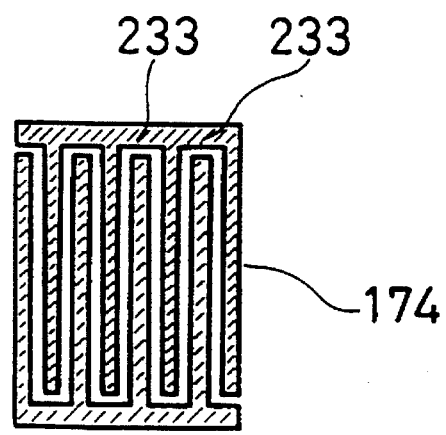

Additionally, as shown in FIG. 23 (a), when a short-circuit electrode pattern 231 is formed to a spiral inductor electrode pattern 229 for a short-circuit connection between the adjacent winding electrode patterns, the reactive value can be finely controlled by trimming the above-noted short-circuit electrode pattern by means of a laser or the like. As a result, the filter characteristics can be finely controlled after mounting the SAW filter substrate to the package.

Furthermore, in the seventh, ninth, and tenth embodiments, each reactive value can be finely controlled by trimming the part of electrode pattern 232 in FIG. 23 (b) in case of meander line inductor electrodes 173, 203, 223 etc. and also by trimming the part of electrode pattern 233 in FIG. 23 (c) in case of inter-digital capacitor electrodes 174, 204, 224 etc.

Also in the seventh, ninth, and tenth embodiments, the description referred only to an example of a two-stage concatenately connected SAW filter. It is clear that this invention includes a general resonator type SAW filter or a multielectrode type SAW filter and can be applied to the entire surface acoustic wave elements accompanied by reflectors.

Furthermore, it is preferable that ST cut crystal with excellent thermal characteristics is used for the piezoelectric substrate of this invention. However, it is also possible to use substrates such as $LiTaO_3$, $LiNbO_3$, $Li_2B_4O_7$. In addition, it is preferable that aluminium with comparatively low density is used for the electrode material from the viewpoint that the electrode thickness can be controlled easily, but gold electrodes are also applicable. Also, it is clear that this invention can be applied not only to resonators using a surface acoustic wave of Rayleigh wave, but also to resonators using a surface skimming bulk wave (SSBW) or a pseudo surface acoustic wave (Leaky SAW) etc.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A surface acoustic wave (SAW) filter, comprising three surface acoustic wave (SAW) resonators, each of said SAW resonators comprising an inter-digital transducer (IDT) electrode and reflectors on both sides of the IDT electrode, the SAW resonators being disposed on a surface of a piezoelectric substrate, wherein said SAW resonators form an acoustic coupling by being disposed close to each other in parallel to a propagation direction of the SAW resonators, wherein IDT electrodes of an adjacent pair of SAW resonators are electrically independent from each other, and wherein an IDT electrode of a SAW resonator positioned between two other SAW resonators is totally grounded.

2. The surface acoustic wave filter as in claim 1, wherein an IDT electrode of a first one of the SAW resonators is connected to a balanced type input terminal, and wherein an IDT electrode of a second SAW resonator is connected to a balanced output terminal.

3. The surface acoustic wave filter as in claim 1, wherein the IDT electrode that is totally grounded is grounded via electrode patterns disposed between the IDT electrodes of the SAW resonators the reflectors of the resonators.

4. The surface acoustic wave filter as in claim 1, wherein a line width of electrode patterns for bus bars comprising IDT electrodes that are not totally grounded is selected to be larger than a line width of electrode patterns for bus bars comprising the IDT electrode that is totally grounded.

5. The surface acoustic wave filter as in claim 1, wherein a plurality of said filter are concatenately connected through several interstage connecting electrode patterns formed on the surface of the piezoelectric substrate.

6. The surface acoustic wave filter as in claim 5, wherein a part of said several interstage connecting electrode patterns has an electrode pad formed for bonding.

7. The surface acoustic wave filter as in claim 5, wherein said several interstage connected electrode patterns are connected to each other via a reactive element.

8. The surface acoustic wave filter as in claim 5, wherein one of said several interstage connecting electrode patterns is grounded, and another is grounded via a reactive element.

9. The surface acoustic wave filter as in claims 7 or 8, wherein said reactive element is a spiral inductor formed by an electrode pattern disposed on the surface of the piezoelectric substrate.

10. The surface acoustic wave filter of claim 1, wherein the IDT electrodes of the adjacent pair of SAW resonators are made electrically independent from each other by physically dividing electrode patterns that define bus bars disposed between the adjacent SAW resonators.

* * * * *